United States Patent
Madhavan et al.

(10) Patent No.: US 11,393,754 B2
(45) Date of Patent: Jul. 19, 2022

(54) CONTACT OVER ACTIVE GATE STRUCTURES WITH ETCH STOP LAYERS FOR ADVANCED INTEGRATED CIRCUIT STRUCTURE FABRICATION

(71) Applicant: Intel Corporation, Santa Clara, CA (US)

(72) Inventors: Atul Madhavan, Portland, OR (US); Nicholas J. Kybert, Portland, OR (US); Mohit K. Haran, Hillsboro, OR (US); Hiten Kothari, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 16/147,541

(22) Filed: Sep. 28, 2018

(65) Prior Publication Data

US 2020/0105672 A1   Apr. 2, 2020

(51) Int. Cl.
*H01L 23/535* (2006.01)
*H01L 21/02* (2006.01)
(Continued)

(52) U.S. Cl.
CPC ........ *H01L 23/535* (2013.01); *H01L 21/0217* (2013.01); *H01L 21/02126* (2013.01);
(Continued)

(58) Field of Classification Search
CPC ............. H01L 23/535; H01L 21/02126; H01L 21/02167; H01L 21/0217; H01L 21/02178;
(Continued)

(56) References Cited

U.S. PATENT DOCUMENTS 10,134,633 B1 * 11/2018 Kamineni ............. H01L 29/785
2014/0077305 A1    3/2014 Pethe
(Continued)

FOREIGN PATENT DOCUMENTS

CN       106910708 B  *  6/2020  ......... H01L 21/0332
TW       201803020 A  *  1/2018  ....... H01L 21/30604

OTHER PUBLICATIONS

Search Report for European Patent Application No. 19183085, dated Nov. 26, 2019, 12 pgs.

*Primary Examiner* — Brigitte A Paterson
*Assistant Examiner* — Andre C Stevenson
(74) *Attorney, Agent, or Firm* — Schwabe, Williamson & Wyatt, P.C.

(57) ABSTRACT

Contact over active gate (COAG) structures with etch stop layers, and methods of fabricating contact over active gate (COAG) structures using etch stop layers, are described. In an example, an integrated circuit structure includes a plurality of gate structures above substrate, each of the gate structures including a gate insulating layer thereon. A plurality of conductive trench contact structures is alternating with the plurality of gate structures, each of the conductive trench contact structures including a trench insulating layer thereon. A first dielectric etch stop layer is directly on and continuous over the trench insulating layers and the gate insulating layers. A second dielectric etch stop layer is directly on and continuous over the first dielectric etch stop layer, the second dielectric etch stop layer distinct from the first dielectric etch stop layer. An interlayer dielectric material is on the second dielectric etch stop layer.

8 Claims, 17 Drawing Sheets

(51) Int. Cl.
    *H01L 21/311*     (2006.01)
    *H01L 21/768*     (2006.01)
    *H01L 21/8234*     (2006.01)
    *H01L 27/088*     (2006.01)
    *H01L 29/51*     (2006.01)
    *H01L 21/027*     (2006.01)
    *H01L 29/45*     (2006.01)

(52) U.S. Cl.
    CPC .. *H01L 21/02167* (2013.01); *H01L 21/02178* (2013.01); *H01L 21/31111* (2013.01); *H01L 21/31116* (2013.01); *H01L 21/76802* (2013.01); *H01L 21/76877* (2013.01); *H01L 21/823437* (2013.01); *H01L 21/823475* (2013.01); *H01L 27/0886* (2013.01); *H01L 29/518* (2013.01); *H01L 21/0228* (2013.01); *H01L 21/0276* (2013.01); *H01L 21/02164* (2013.01); *H01L 21/31144* (2013.01); *H01L 29/45* (2013.01)

(58) Field of Classification Search
    CPC ......... H01L 21/31111; H01L 21/31116; H01L 21/76802; H01L 21/76877; H01L 21/823437; H01L 21/823475; H01L 27/0886; H01L 29/518; H01L 21/02164; H01L 21/0228; H01L 21/0276; H01L 21/31144; H01L 29/45; H01L 21/823857; H01L 21/76897
    See application file for complete search history.

(56) References Cited

U.S. PATENT DOCUMENTS

| | | |
|---|---|---|
| 2016/0005650 A1* | 1/2016 | Yang ................. H01L 29/66575 438/303 |
| 2016/0293485 A1 | 10/2016 | Song |
| 2017/0317076 A1 | 11/2017 | Shen |
| 2018/0005876 A1 | 1/2018 | Tung |
| 2018/0096850 A1 | 4/2018 | Lu |
| 2018/0151421 A1 | 5/2018 | Chen |
| 2021/0057230 A1* | 2/2021 | Blackwell ............. H01L 29/785 |

* cited by examiner

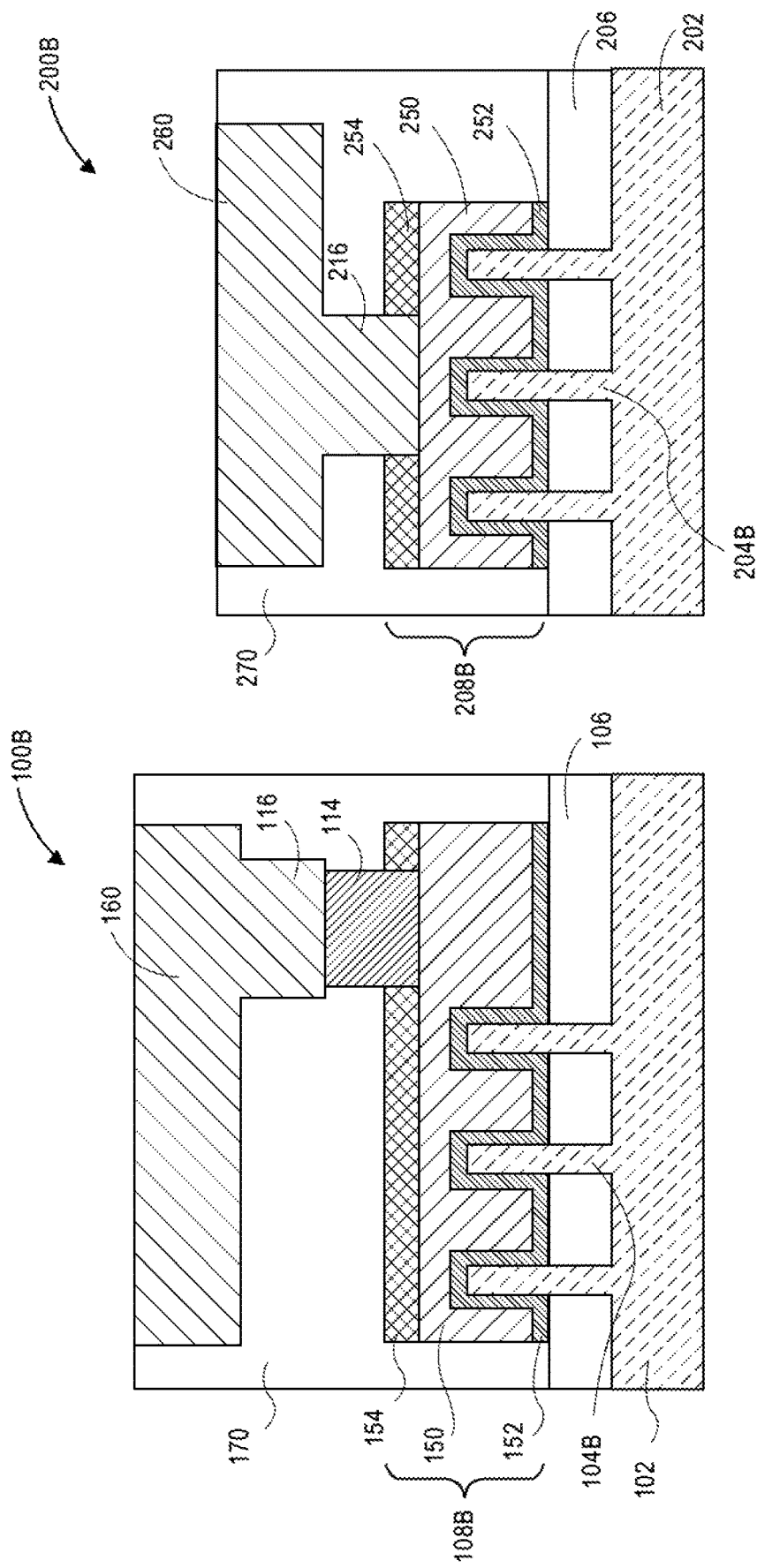

CONTACT OVER ACTIVE GATE STRUCTURES WITH ETCH STOP LAYERS FOR ADVANCED INTEGRATED CIRCUIT STRUCTURE FABRICATION

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 1B illustrates a cross-sectional view of a non-planar semiconductor device having a gate contact disposed over an inactive portion of a gate electrode.

FIG. 2B illustrates a cross-sectional view of a non-planar semiconductor device having a gate contact via disposed over an active portion of a gate electrode, in accordance with an embodiment of the present disclosure.

DESCRIPTION OF THE EMBODIMENTS

Figure 2A:
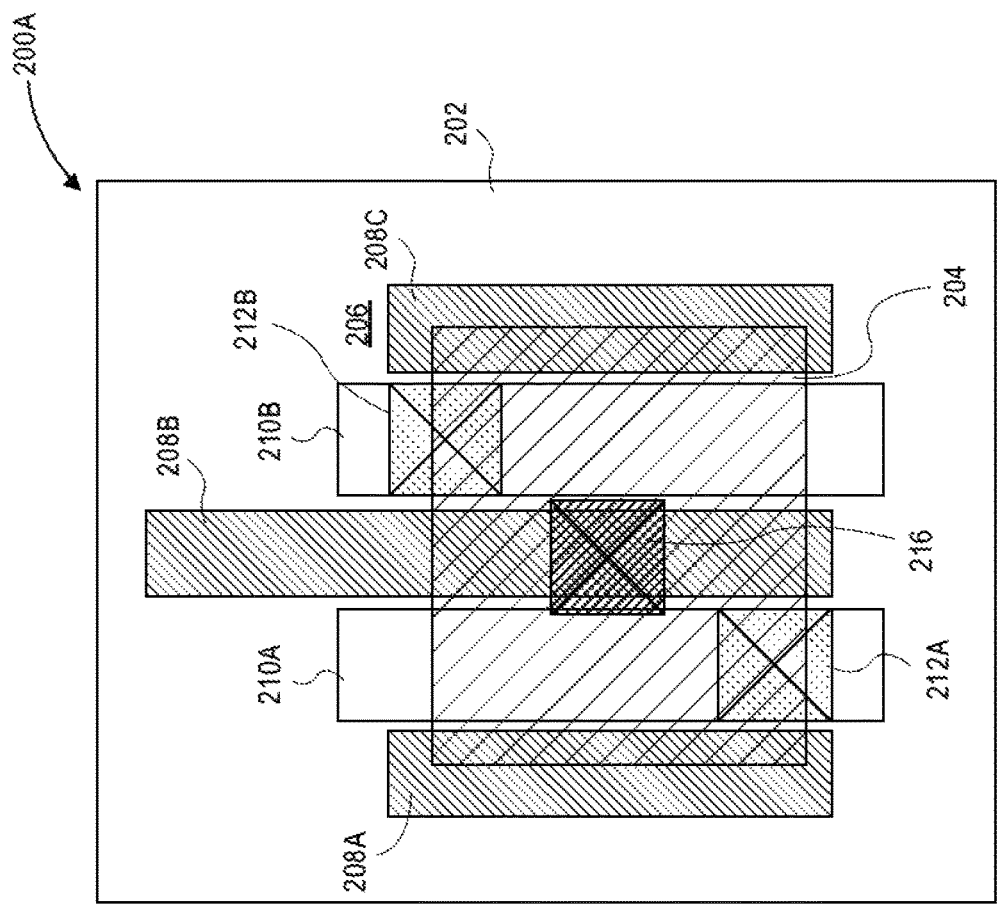
FIG. 2A illustrates a plan view of a semiconductor device having a gate contact via disposed over an active portion of a gate electrode, in accordance with an embodiment of the present disclosure.

Contact over active gate (COAG) structures with etch stop layers, and methods of fabricating contact over active gate (COAG) structures using etch stop layers, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In technologies where space and layout constraints are somewhat relaxed compared with current generation space and layout constraints, a contact to gate structure may be fabricated by making contact to a portion of the gate electrode disposed over an isolation region. As an example, FIG. 1A illustrates a plan view of a semiconductor device having a gate contact disposed over an inactive portion of a gate electrode.

Figure 1A:
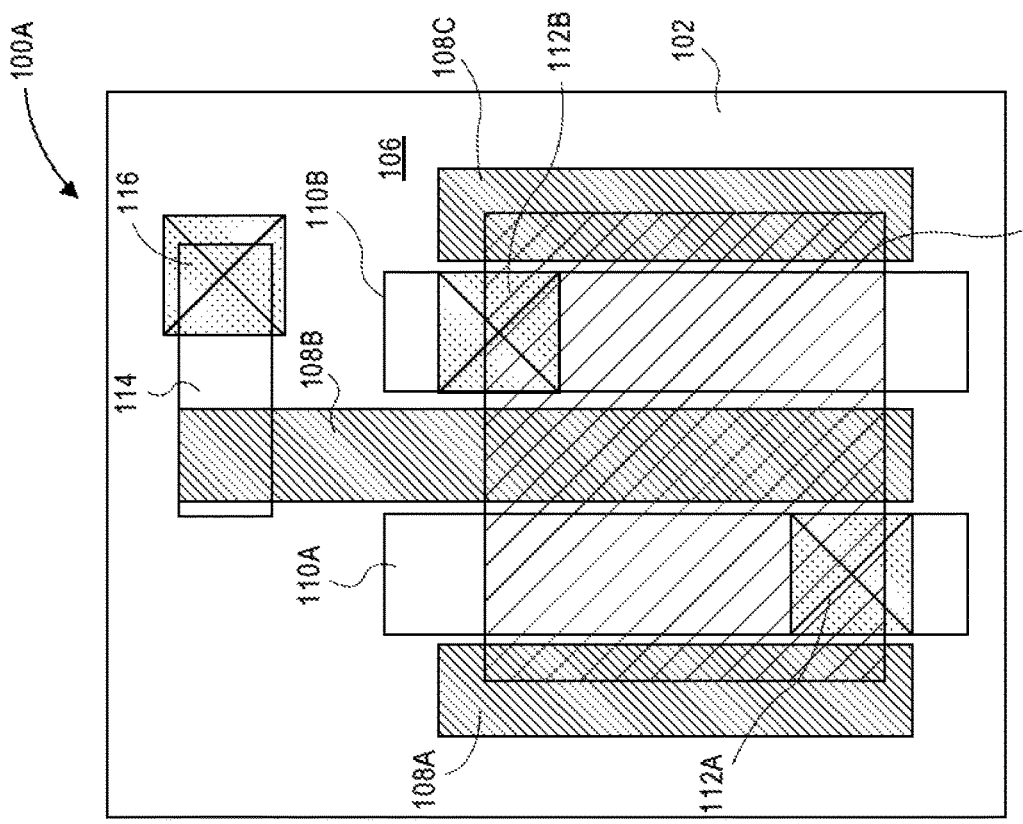
FIG. 1A illustrates a plan view of a semiconductor device having a gate contact disposed over an inactive portion of a gate electrode.

Referring to FIG. 1A, a semiconductor structure or device 100A includes a diffusion or active region 104 disposed in a substrate 102, and within an isolation region 106. One or more gate lines (also known as poly lines), such as gate lines 108A, 108B and 108C are disposed over the diffusion or active region 104 as well as over a portion of the isolation region 106. Source or drain contacts (also known as trench contacts), such as contacts 110A and 110B, are disposed over source and drain regions of the semiconductor structure or device 100A. Trench contact vias 112A and 112B provide contact to trench contacts 110A and 110B, respectively. A separate gate contact 114, and overlying gate contact via 116, provides contact to gate line 108B. In contrast to the source or drain trench contacts 110A or 110B, the gate contact 114 is disposed, from a plan view perspective, over isolation region 106, but not over diffusion or active region 104. Furthermore, neither the gate contact 114 nor gate contact via 116 is disposed between the source or drain trench contacts 110A and 110B.

FIG. 1B illustrates a cross-sectional view of a non-planar semiconductor device having a gate contact disposed over an inactive portion of a gate electrode. Referring to FIG. 1B, a semiconductor structure or device 100B, e.g. a non-planar version of device 100A of FIG. 1A, includes a non-planar diffusion or active region 104C (e.g., a fin structure) formed from substrate 102, and within isolation region 106. Gate line 108B is disposed over the non-planar diffusion or active region 104B as well as over a portion of the isolation region 106. As shown, gate line 108B includes a gate electrode 150 and gate dielectric layer 152, along with a dielectric cap layer 154. Gate contact 114, and overlying gate contact via 116 are also seen from this perspective, along with an overlying metal interconnect 160, all of which are disposed in inter-layer dielectric stacks or layers 170. Also seen from the perspective of FIG. 1B, the gate contact 114 is disposed over isolation region 106, but not over non-planar diffusion or active region 104B.

Referring again to FIGS. 1A and 1B, the arrangement of semiconductor structure or device 100A and 100B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 2A illustrates a plan view of a semiconductor device having a gate contact via disposed over an active portion of a gate electrode, in accordance with an embodiment of the present disclosure. Referring to FIG. 2A, a semiconductor structure or device 200A includes a diffusion or active region 204 disposed in a substrate 202, and within an isolation region 206. One or more gate lines, such as gate lines 208A, 208B and 208C are disposed over the diffusion or active region 204 as well as over a portion of the isolation region 206. Source or drain trench contacts, such as trench contacts 210A and 210B, are disposed over source and drain regions of the semiconductor structure or device 200A. Trench contact vias 212A and 212B provide contact to trench contacts 210A and 210B, respectively. A gate contact via 216, with no intervening separate gate contact layer, provides contact to gate line 208B. In contrast to FIG. 1A, the gate contact 216 is disposed, from a plan view perspective, over the diffusion or active region 204 and between the source or drain contacts 210A and 210B.

FIG. 2B illustrates a cross-sectional view of a non-planar semiconductor device having a gate contact via disposed over an active portion of a gate electrode, in accordance with an embodiment of the present disclosure. Referring to FIG. 2B, a semiconductor structure or device 200B, e.g. a non-planar version of device 200A of FIG. 2A, includes a non-planar diffusion or active region 204B (e.g., a fin structure) formed from substrate 202, and within isolation region 206. Gate line 208B is disposed over the non-planar diffusion or active region 204B as well as over a portion of the isolation region 206. As shown, gate line 208B includes a gate electrode 250 and gate dielectric layer 252, along with a dielectric cap layer 254. The gate contact via 216 is also seen from this perspective, along with an overlying metal interconnect 260, both of which are disposed in inter-layer dielectric stacks or layers 270. Also seen from the perspective of FIG. 2B, the gate contact via 216 is disposed over non-planar diffusion or active region 204B.

Thus, referring again to FIGS. 2A and 2B, in an embodiment, trench contact vias 212A, 212B and gate contact via 216 are formed in a same layer and are essentially co-planar. In comparison to FIGS. 1A and 1B, the contact to the gate line would otherwise include and additional gate contact layer, e.g., which could be run perpendicular to the corresponding gate line. In the structure(s) described in association with FIGS. 2A and 2B, however, the fabrication of structures 200A and 200B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208A and 208B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 208A and 208B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., trench insulating layer (TILA)). The additional dielectric material is included as a trench contact dielectric cap layer with etch characteristics different from the gate dielectric material cap layer used for trench contact alignment in a gate aligned contact process (GAP) processing scheme (e.g., use of a gate insulating layer (GILA)).

In accordance with one or more embodiments of the present disclosure, etch stop layers stacks are implemented to provide for improved via contact selectivity to TILA/GILA and for substantially improved yield. In an embodiment, a via opening etch lands on an upper dielectric etch stop layer with very high selectivity. The upper dielectric etch stop layer is etched with selectivity to an underlying lower dielectric etch stop layer. The lower dielectric etch stop layer is then etched to expose underlying TILA/GILA regions. The multi-operation breakthrough process may be implemented to reduce loss to the underlying TILA/GILA regions and enable significant yield improvement.

As an exemplary fabrication scheme, FIGS. 3A-3D illustrate cross-sectional views illustrating various operations in a method of fabricating a contact over active gate (COAG) structures having an etch stop layers, in accordance with an embodiment of the present disclosure.

Figure 3A:
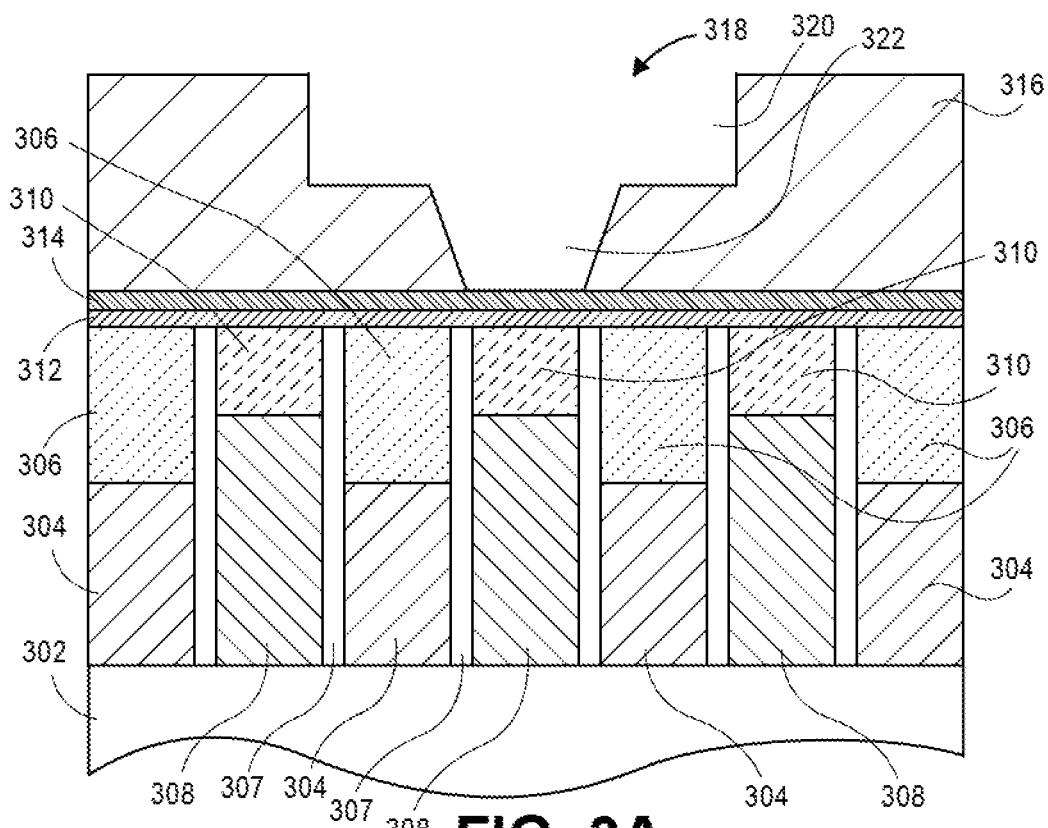
FIGS. 3A-3D illustrate cross-sectional views illustrating various operations in a method of fabricating a contact over active gate (COAG) structures having an etch stop layers, in accordance with an embodiment of the present disclosure.

Referring to FIG. 3A, a plurality of gate structures 304 is formed above a fin or substrate 302. Gate structures 304 may include a gate dielectric and gate electrode. Each of the gate structures 304 includes a gate insulating layer (GILA) 306 or gate dielectric cap thereon. Dielectric spacers 307 may be along sidewalls of the each gate stack 304/GILA 306 pairing. The gate structures 304 alternate with conductive trench contact structures 308. Each of the conductive trench contact structures 308 includes a trench insulating layer (TILA) 310 or contact dielectric cap thereon. A first dielectric etch stop layer 312 is directly on and is continuous over the trench insulating layers 310 and the gate insulating layers 306 and, possibly, the dielectric spacers 307. A second dielectric etch stop layer 314 is directly on and continuous over the first dielectric etch stop layer 312. The second dielectric etch stop layer 314 is distinct from the first dielectric etch stop layer 312. An interlayer dielectric (ILD) material 316 is on the second dielectric etch stop layer 314.

Referring again to FIG. 3A, an opening 318 is formed in the ILD material 316. The opening 318 may include a trench portion 320 and a via portion 322. In an embodiment, opening 318 is formed in ILD material 316 using dry or plasma etch process. The etch process stops on the second dielectric etch stop layer 314. In one embodiment, the etch used to form opening 318 lands with greater than 10:1, and preferably more than 20:1 selectivity to the second dielectric etch stop layer 314. In doing so, there is minimal to no loss or erosion of TILA/GILA structures as a result of the etch process used to form opening 318. Also, there is minimal to no loss or erosion of TILA/GILA structures as a result of cleans processes subsequently used to clean opening 318 prior to further processing, where such cleans processes may otherwise undesirably oxidize TILA/GILA surfaces.

Figure 3B:
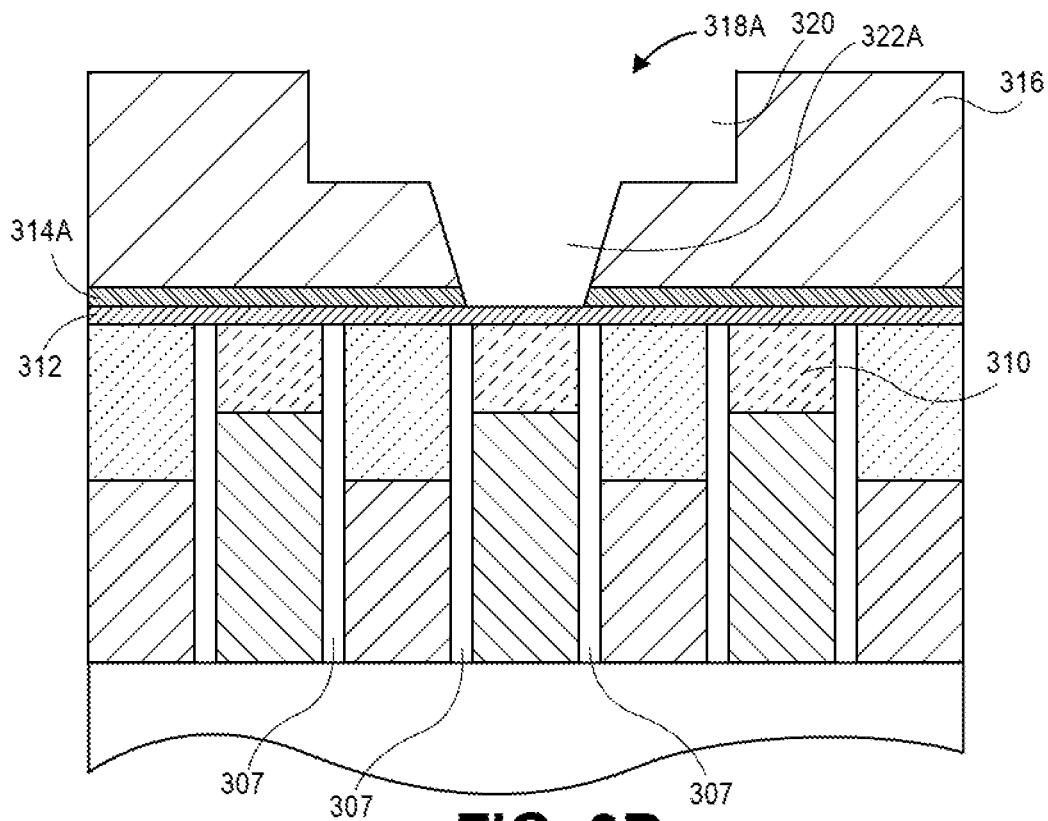

Referring to FIG. 3B, the via portion 322 of opening 318 is extended through the second dielectric etch stop layer 314 to form opening 318A having via portion 322A and patterned second dielectric etch stop layer 314A.

Figure 3C:
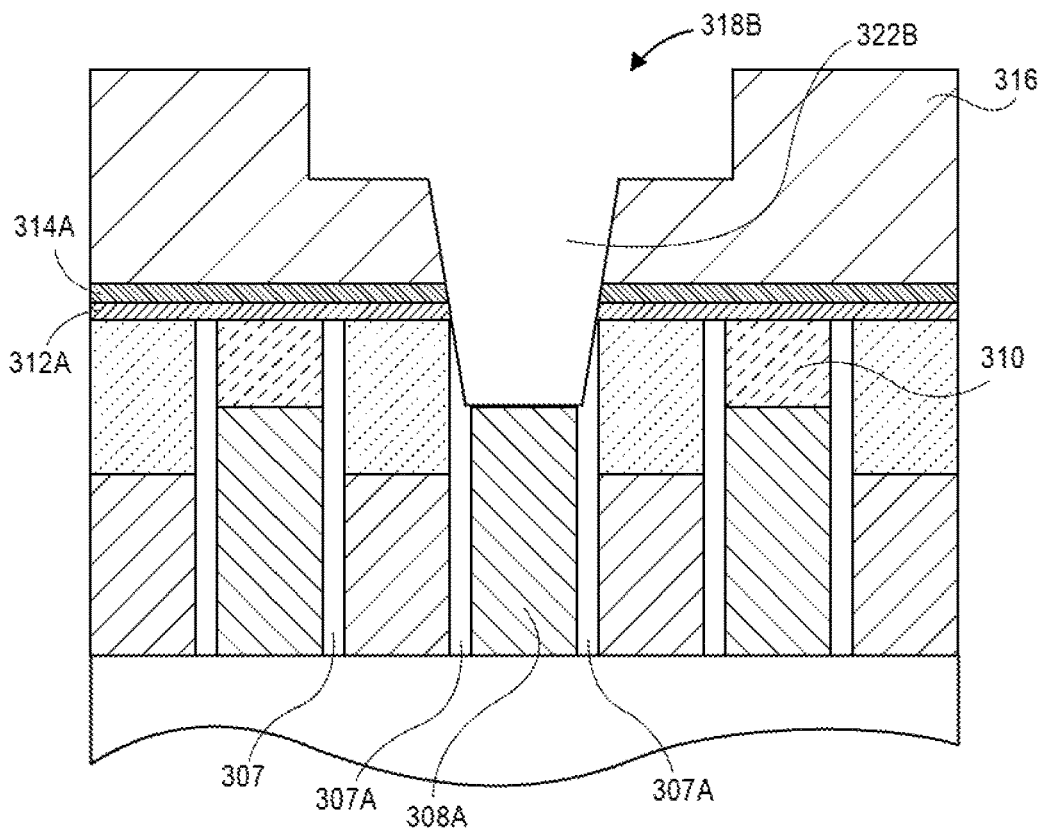

Referring to FIG. 3C, The via portion 322A of opening 318A is then extended through the first dielectric etch stop layer 312 to form opening 318B having via portion 322B and patterned first dielectric etch stop layer 312A. In one embodiment, the via opening 322B extends into (e.g., removes) one of the TILA structures 310 to expose a corresponding one of the trench contact structures 308, as is depicted, for subsequent electrical contact formation. In another embodiment, not depicted, the via opening 322B extends into (e.g., removes) one of the GILA structures 306 to expose a corresponding one of the gate structures 304, for subsequent electrical contact formation.

In an embodiment, via portion 322B of opening 318B is formed in a single dry or plasma etch process that both forms patterned first dielectric etch stop layer 312A and removes the targeted TILA structure 310 (or GILA structure 306). In another embodiment, via portion 322B of opening 318B is formed using a first dry or plasma etch process to form patterned first dielectric etch stop layer 312A, followed by a second dry or plasma etch process that removes the targeted TILA structure 310 (or GILA structure 306). It is to be appreciated that formation of via opening 322B may not remove the one of the TILA structures 310 with perfect selectivity to other exposed materials. For example, dielectric spacer erosion may occur to form eroded dielectric spacers 307A. Erosion may also extend into a neighboring GILA structure 306, as is depicted. Nonetheless, in accordance with embodiments of the present disclosure, such erosion is substantially mitigated by a process involving first 312 and second 314 dielectric etch stop layers, as compared with a process that does not involve use of first 312 and second 314 dielectric etch stop layers.

Figure 3D:
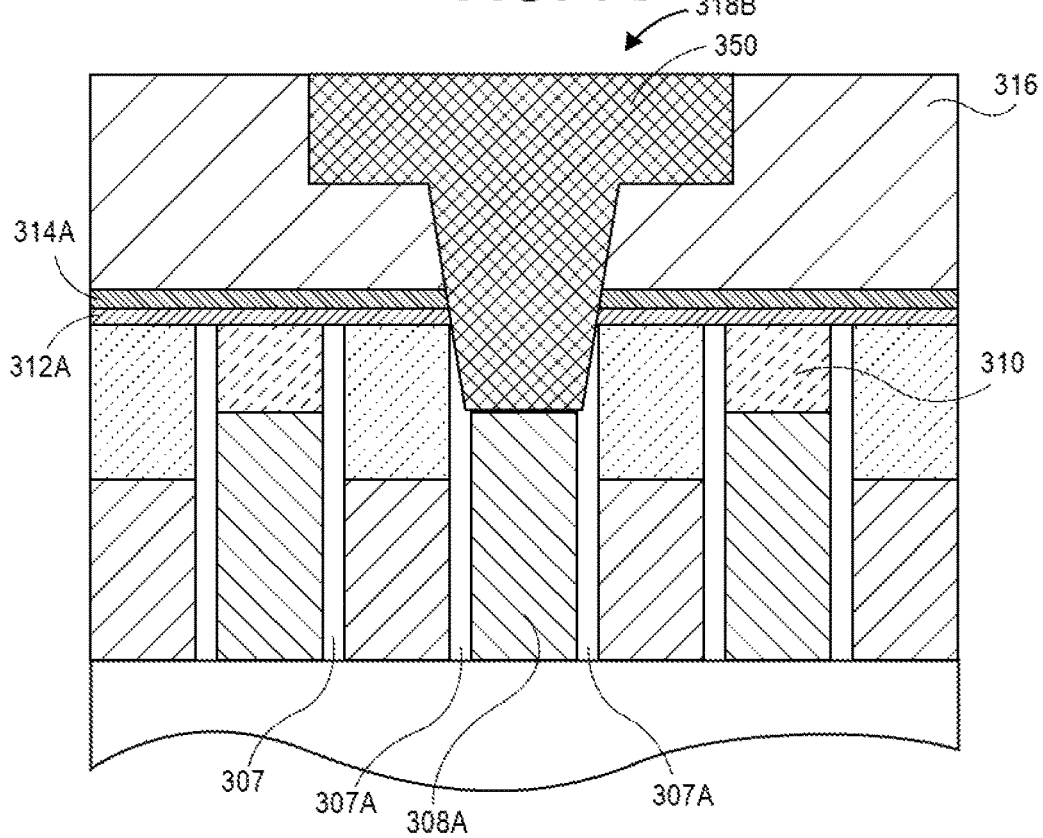

Referring to FIG. 3D, a conductive structure 350 is formed in opening 318B. In an embodiment, conductive structure 350 includes an upper conductive line or interconnect and a lower conductive via.

Referring to FIGS. 3A-3D, in an embodiment, ILD material 316 is a low-k material. In a particular embodiment, ILD material 316 is a carbon doped oxide (CDO) material which may also be referred to as a SiOCH film, since the material includes silicon, oxygen, carbon and hydrogen. In an embodiment, opening 318 is formed in ILD material 316 using a fluorine-based dry or plasma etch process.

In an embodiment, second etch stop layer 314 is highly resistant to the fluorine-based dry or plasma etch process used to form opening 322 in ILD material 316. In an embodiment, the second etch stop layer 314 includes a metal oxide material. In one such embodiment, the metal oxide material is an aluminum oxide material. In a particular such embodiment, the second etch stop layer 314 includes approximately 35-40 atomic % aluminum and 60-65 atomic % oxygen. Impurities may also be included, such as 0.5-1 atomic percent hydrogen and 0.1-0.5 atomic % carbon. In an embodiment, the second etch stop layer 314 is an aluminum oxide material formed using atomic deposition (ALD) with trimethylaluminum (TMA) and water as precursors. In an embodiment, the second etch stop layer 314 is an amorphous material layer. In an embodiment, the second etch stop layer 314 has a thickness in the range of 20-120 Angstroms.

In an embodiment, second etch stop layer 314 is etchable by a highly selective wet etch process, such as a wet etch process involving use of a glycol ether, a cyclic amine, a glycol, an amine, or a combination of two or more thereof. Not to be bound by theory, in an embodiment, the second etch stop layer 314 becomes surface-fluorinated during the fluorine-based dry or plasma etch process used to form opening 318. Upon exposure to the wet etch, HF may be formed as a very localized etchant for patterning the second etch stop layer 314. It is to be appreciated that use of an aluminum oxide as a metal oxide material for second etch stop layer 314 may have superior wet etch characteristics as compared against other metal oxides (such as titanium oxide, hafnium oxide or zirconium oxide) which have proven difficult to wet etch.

In an embodiment, first etch stop layer 312 is highly resistant to the wet etch process used to pattern second dielectric etch stop layer 314. In an embodiment, the first etch stop layer 312 includes a silicon nitride material. In one such embodiment, the silicon nitride material has a lower dielectric constant than the metal oxide material of the second dielectric etch stop layer 314. In a particular such embodiment, the first etch stop layer 312 includes approximately 40-50 atomic % nitrogen, 30-40 atomic % silicon, and 10-20 atomic % hydrogen. Impurities may also be included, such as 1-2 atomic percent oxygen. In an embodiment, the first etch stop layer 312 is an amorphous material layer. In an embodiment, the first etch stop layer 312 has a thickness in the range of 50-150 Angstroms.

In an embodiment, GILA structures 306 underlying the first dielectric etch stop layer 312 are composed of a silicon nitride material having a different composition than a silicon nitride material of the first etch stop layer 312. In one such embodiment, GILA structures 306 are an amorphous silicon nitride material including approximately 50-55 atomic % nitrogen, 35-40 atomic % silicon, and 5-10 atomic % hydrogen. Impurities may also be included, such as 0.1-0.3 atomic percent oxygen and/or around 0.1% carbon. In an embodiment, the TILA structures 310 underlying the first dielectric etch stop layer 312 are composed of a silicon carbide material, such as a silicon carbide material formed in a high density plasma tool.

As another exemplary fabrication scheme, FIGS. 4A-4D illustrate cross-sectional views representing various operations in a method of fabricating a semiconductor structure having a gate contact structure disposed over an active portion of a gate, in accordance with an embodiment of the present disclosure.

Figure 4A:
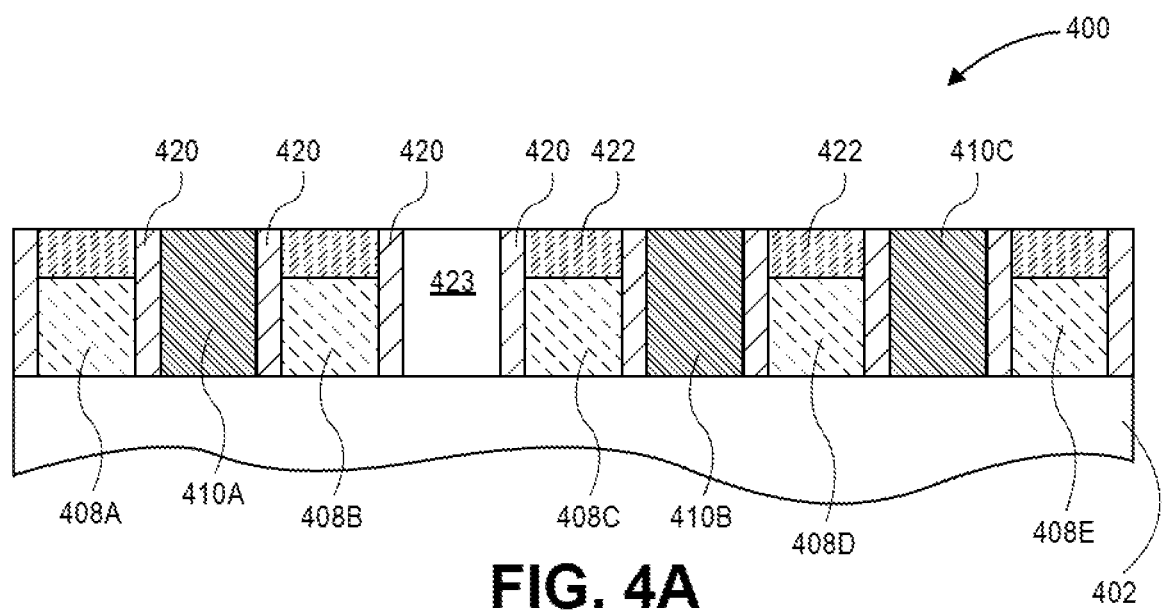
FIGS. 4A-4D illustrate cross-sectional views representing various operations in a method of fabricating a semiconductor structure having a gate contact structure disposed over an active portion of a gate, in accordance with an embodiment of the present disclosure.

Referring to FIG. 4A, a semiconductor structure 400 is provided following trench contact (TCN) formation. It is to be appreciated that the specific arrangement of structure 400 is used for illustration purposes only, and that a variety of possible layouts may benefit from embodiments of the disclosure described herein. The semiconductor structure 400 includes one or more gate stack structures, such as gate stack structures 408A-408E disposed above a substrate 402. The gate stack structures may include a gate dielectric layer and a gate electrode. Trench contacts, e.g., contacts to diffusion regions of substrate 402, such as trench contacts 410A-410C are also included in structure 400 and are spaced apart from gate stack structures 408A-408E by dielectric spacers 420. An insulating cap layer 422 may be disposed on the gate stack structures 408A-408E (e.g., GILA), as is also depicted in FIG. 4A. As is also depicted in FIG. 4A, contact blocking regions or "contact plugs," such as region 423 fabricated from an inter-layer dielectric material, may be included in regions where contact formation is to be blocked.

In an embodiment, providing structure 400 involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures 408A-408E may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 400. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Figure 4B:
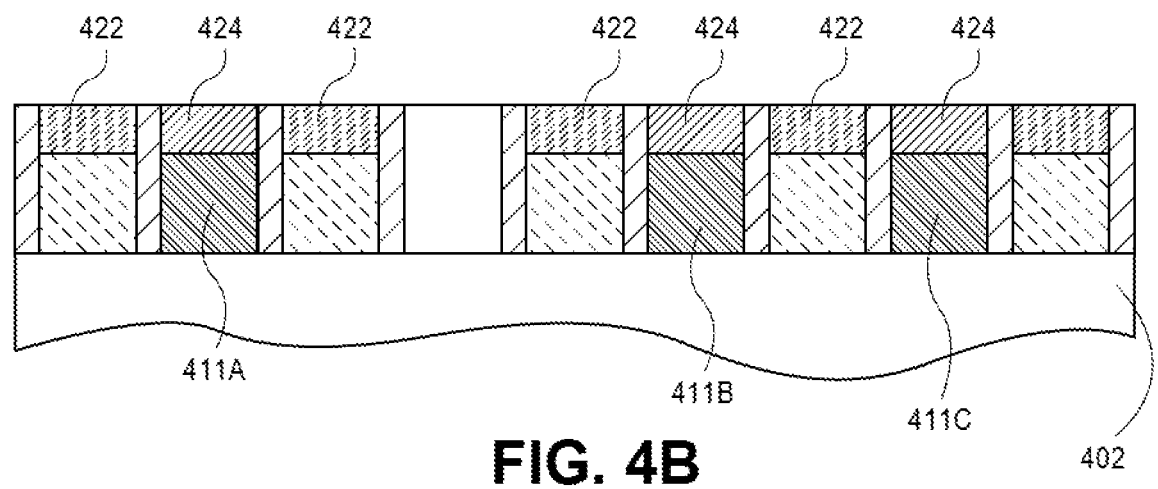

Referring to FIG. 4B, the trench contacts 410A-410C of the structure 400 are recessed within spacers 420 to provide recessed trench contacts 411A-411C that have a height below the top surface of spacers 420 and insulating cap layer 422. An insulating cap layer 424 is then formed on recessed trench contacts 411A-411C (e.g., TILA). In accordance with an embodiment of the present disclosure, the insulating cap layer 424 on recessed trench contacts 411A-411C is composed of a material having a different etch characteristic than insulating cap layer 422 on gate stack structures 408A-408E. As will be seen in subsequent processing operations, such a difference may be exploited to etch one of 422/424 selectively from the other of 422/424.

The trench contacts 410A-410C may be recessed by a process selective to the materials of spacers 420 and insulating cap layer 422. For example, in one embodiment, the trench contacts 410A-410C are recessed by an etch process such as a wet etch process or dry etch process. Insulating cap layer 424 may be formed by a process suitable to provide a conformal and sealing layer above the exposed portions of trench contacts 410A-410C. For example, in one embodiment, insulating cap layer 424 is formed by a chemical vapor deposition (CVD) process as a conformal layer above the entire structure. The conformal layer is then planarized, e.g., by chemical mechanical polishing (CMP), to provide insulating cap layer 424 material only above trench contacts 410A-410C, and re-exposing spacers 420 and insulating cap layer 422.

Regarding suitable material combinations for insulating cap layers 422/424, in one embodiment, one of the pair of 422/424 is composed of silicon oxide while the other is composed of silicon nitride. In another embodiment, one of the pair of 422/424 is composed of silicon oxide while the other is composed of carbon doped silicon nitride. In another embodiment, one of the pair of 422/424 is composed of silicon oxide while the other is composed of silicon carbide. In another embodiment, one of the pair of 422/424 is composed of silicon nitride while the other is composed of carbon doped silicon nitride. In another embodiment, one of the pair of 422/424 is composed of silicon nitride while the other is composed of silicon carbide. In another embodiment, one of the pair of 422/424 is composed of carbon doped silicon nitride while the other is composed of silicon carbide.

Figure 4C:
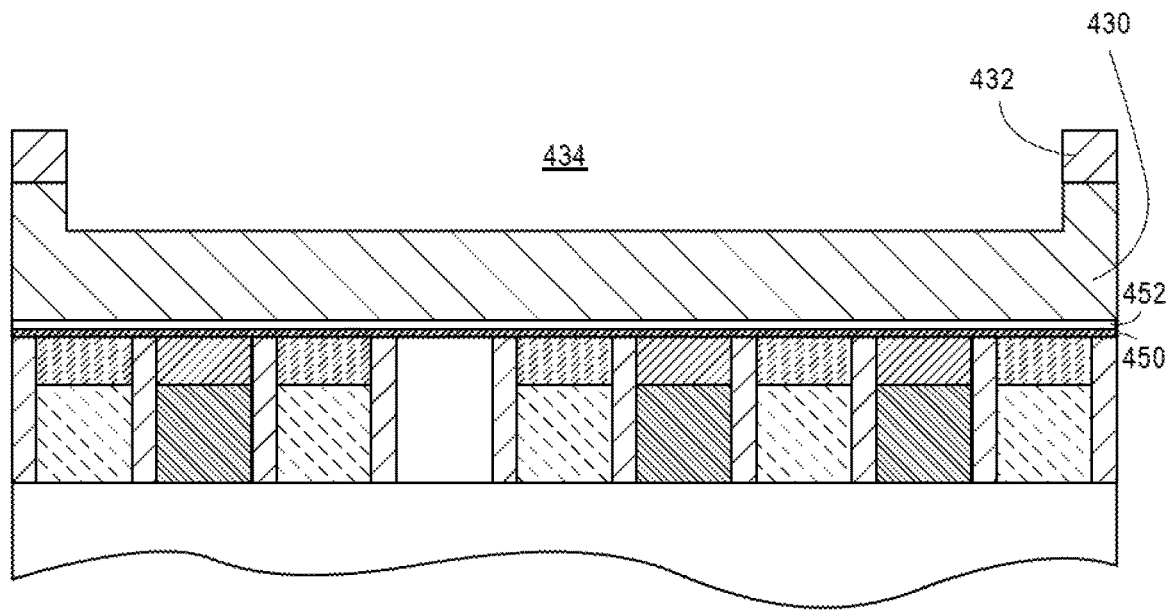

Referring to FIG. 4C, a first dielectric etch stop layer 450 (such as described in association with first dielectric etch stop layer 312) and a second dielectric etch stop layer 452 (such as described in association with second dielectric etch stop layer 314) are formed over the structure of FIG. 4B. An inter-layer dielectric (ILD) 430 and hardmask 432 stack are then formed and patterned to provide, e.g., a metal (0) trench 434 patterned above the structure of FIG. 4B.

The inter-layer dielectric (ILD) 430 may be composed of a material suitable to electrically isolate metal features ultimately formed therein while maintaining a robust structure between front end and back end processing. Furthermore, in an embodiment, the composition of the ILD 430 is selected to be consistent with via etch selectivity for trench contact dielectric cap layer patterning, as described in greater detail below in association with FIG. 4D. In one embodiment, the ILD 430 is composed of a single or several layers of silicon oxide or a single or several layers of a carbon doped oxide (CDO) material. However, in other embodiments, the ILD 430 has a bi-layer composition with a top portion composed of a different material than an underlying bottom portion of the ILD 430. The hardmask layer 432 may be composed of a material suitable to act as a subsequent sacrificial layer. For example, in one embodiment, the hardmask layer 432 is composed substantially of carbon, e.g., as a layer of cross-linked organic polymer. In other embodiments, a silicon nitride or carbon-doped silicon nitride layer is used as a hardmask 432. The inter-layer dielectric (ILD) 430 and hardmask 432 stack may be patterned by a lithography and etch process.

Figure 4D:
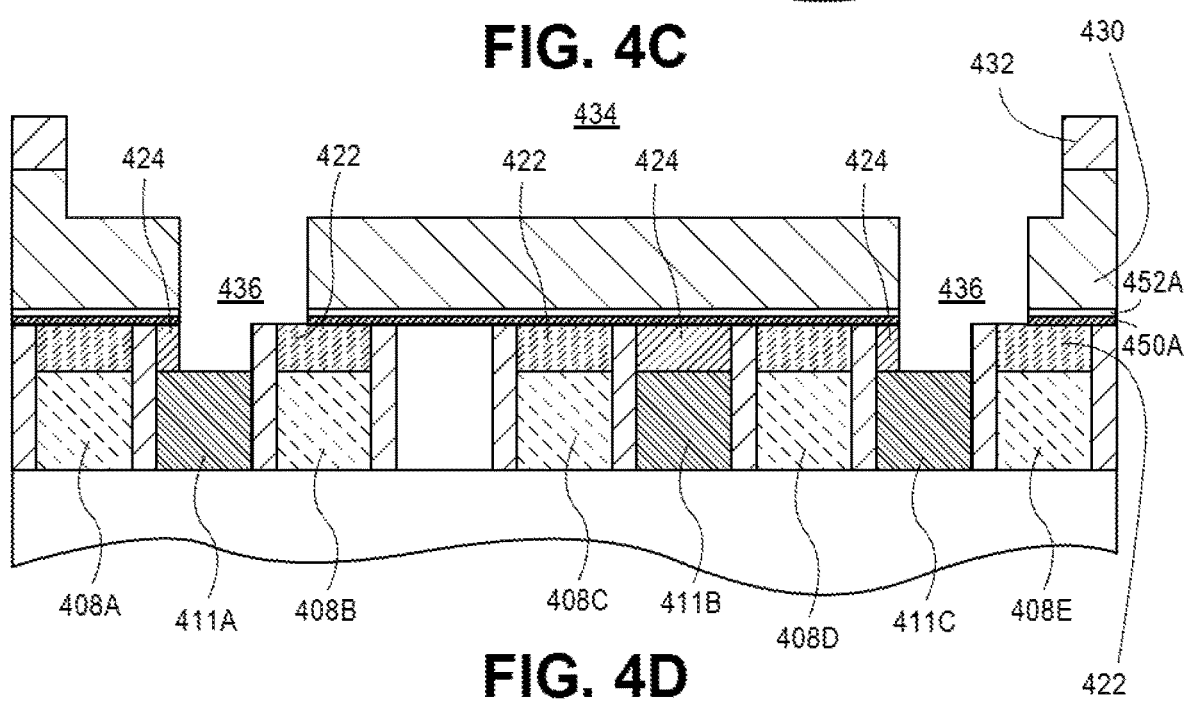

Referring to FIG. 4D, via openings 436 (e.g., VCT) are formed in inter-layer dielectric (ILD) 430, extending from metal (0) trench 434 to one or more of the recessed trench contacts 411A-411C. The via openings 436 may be formed using a multiple-etch process in which second dielectric etch stop layer 452 and first dielectric etch stop layer 450 are sequentially patterned to form a second patterned dielectric etch stop layer 452A and a first patterned dielectric etch stop layer 450A.

For example, in FIG. 4D, via openings are formed to expose recessed trench contacts 411A and 411C. The formation of via openings 436 includes etching of both inter-layer dielectric (ILD) 430 and respective portions of corresponding insulating cap layer 424. In one such embodiment, a portion of insulating cap layer 422 is exposed during patterning of inter-layer dielectric (ILD) 430 (e.g., a portion of insulating cap layer 422 over gate stack structures 408B and 408E is exposed). In that embodiment, insulating cap layer 424 is etched to form via openings 436 selective to (i.e., without significantly etching or impacting) insulating cap layer 422.

In one embodiment, a via opening pattern is ultimately transferred to the insulating cap layer 424 (i.e., the trench contact insulating cap layers) by an etch process without etching the insulating cap layer 422 (i.e., the gate insulating cap layers). The insulating cap layer 424 (TILA) may be composed of any of the following or a combination including silicon oxide, silicon nitride, silicon carbide, carbon doped silicon nitrides, carbon doped silicon oxides, amorphous silicon, various metal oxides and silicates including zirconium oxide, hafnium oxide, lanthanum oxide or a combination thereof. The layer may be deposited using any of the following techniques including CVD, ALD, PECVD, PVD, HDP assisted CVD, low temperature CVD. A corresponding plasma dry etch is developed as a combination of chemical and physical sputtering mechanisms. Coincident polymer deposition may be used to control material removal rate, etch profiles and film selectivity. The dry etch is typically generated with a mix of gases that include $NF_3$, $CHF_3$, $C_4F_8$, HBr and $O_2$ with typically pressures in the range of 30-100 mTorr and a plasma bias of 50-1000 Watts. The dry etch may be engineered to achieve significant etch selectivity between cap layer 424 (TILA) and 422 (GILA) layers to minimize the loss of 422 (GILA) during dry etch of 424 (TILA) to form contacts to the source drain regions of the transistor.

Referring again to FIG. 4D, it is to be appreciated that a similar approach may be implemented to fabricate a via opening pattern that is ultimately transferred to the insulating cap layer 422 (i.e., the trench contact insulating cap layers) by an etch process without etching the insulating cap layer 424 (i.e., the gate insulating cap layers).

Figure 5:
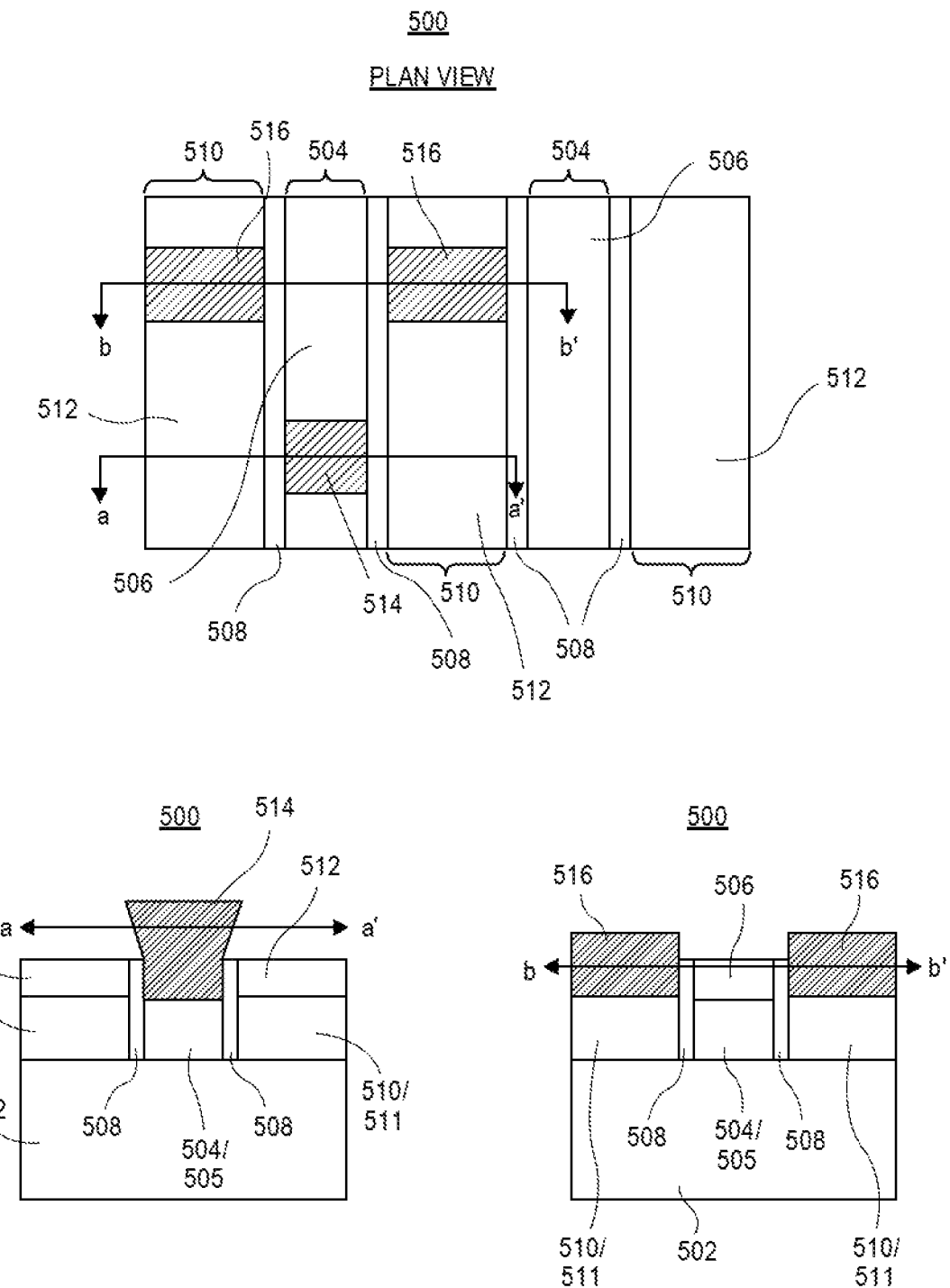
FIG. 5 illustrates a plan view and corresponding cross-sectional views of an integrated circuit structure having trench contacts including an overlying insulating cap layer, in accordance with an embodiment of the present disclosure.

To further exemplify concepts of a contact over active gate (COAG) technology, FIG. 5 illustrates a plan view and corresponding cross-sectional views of an integrated circuit structure having trench contacts including an overlying insulating cap layer, in accordance with an embodiment of the present disclosure.

Referring to FIG. 5, an integrated circuit structure 500 includes a gate line 504 above a semiconductor substrate or fin 502, such as a silicon fin. The gate line 504 includes a gate stack 505 (e.g., including a gate dielectric layer or stack and a gate electrode on the gate dielectric layer or stack) and a gate insulating cap layer 506 on the gate stack 505. Dielectric spacers 508 are along sidewalls of the gate stack 505 and, in an embodiment, along sidewalls of the gate insulating cap layer 506, as is depicted.

Trench contacts 510 are adjacent the sidewalls of the gate line 504, with the dielectric spacers 508 between the gate line 504 and the trench contacts 510. Individual ones of the trench contacts 510 include a conductive contact structure 511 and a trench contact insulating cap layer 512 on the conductive contact structure 511.

Referring again to FIG. 5, a gate contact via 514 is formed in an opening of the gate insulating cap layer 506 and electrically contacts the gate stack 505. In an embodiment, the gate contact via 514 electrically contacts the gate stack 505 at a location over the semiconductor substrate or fin 502 and laterally between the trench contacts 510, as is depicted. In one such embodiment, the trench contact insulating cap layer 512 on the conductive contact structure 511 prevents gate to source shorting or gate to drain shorting by the gate contact via 514.

Referring again to FIG. 5, trench contact vias 516 are formed in an opening of the trench contact insulating cap layer 512 and electrically contact the respective conductive contact structures 511. In an embodiment, the trench contact vias 516 electrically contact the respective conductive contact structures 511 at locations over the semiconductor substrate or fin 502 and laterally adjacent the gate stack 505 of the gate line 504, as is depicted. In one such embodiment, the gate insulating cap layer 506 on the gate stack 505 prevents source to gate shorting or drain to gate shorting by the trench contact vias 516.

It is to be appreciated that differing structural relationships between an insulating gate cap layer and an insulating trench contact cap layer may be fabricated. As examples, FIGS. 6A-6F illustrate cross-sectional views of various integrated circuit structures, each having trench contacts including an overlying insulating cap layer and having gate stacks including an overlying insulating cap layer, in accordance with an embodiment of the present disclosure.

Figure 6A:
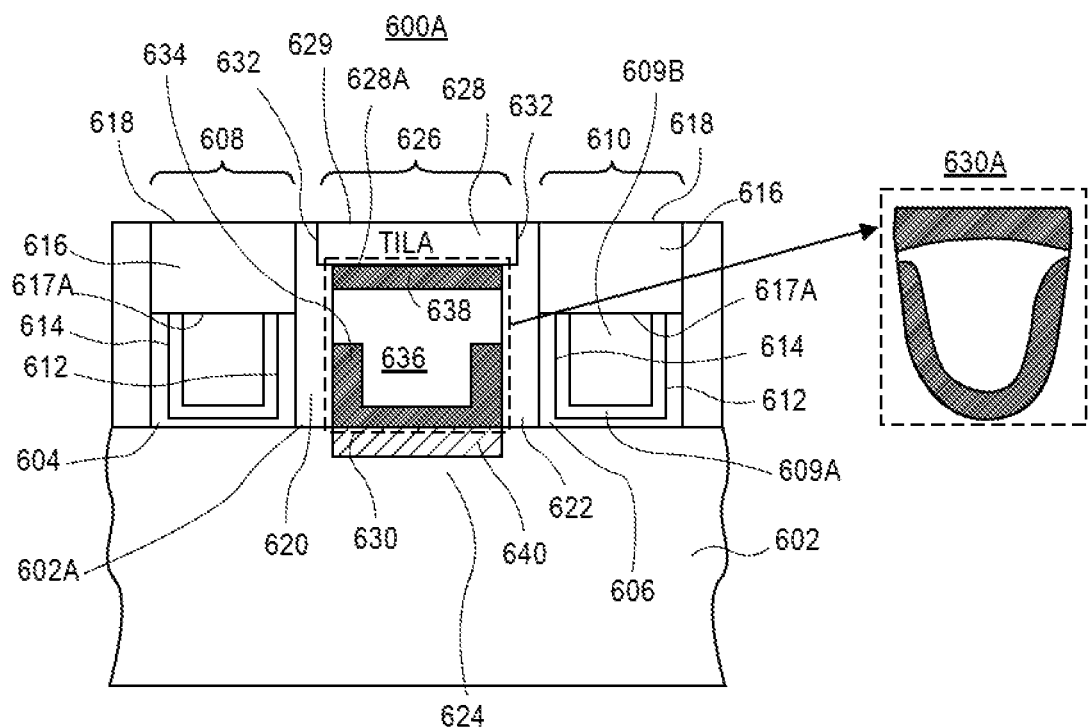
FIGS. 6A-6F illustrate cross-sectional views of various integrated circuit structures, each having trench contacts including an overlying insulating cap layer and having gate stacks including an overlying insulating cap layer, in accordance with an embodiment of the present disclosure.
Figure 6B:
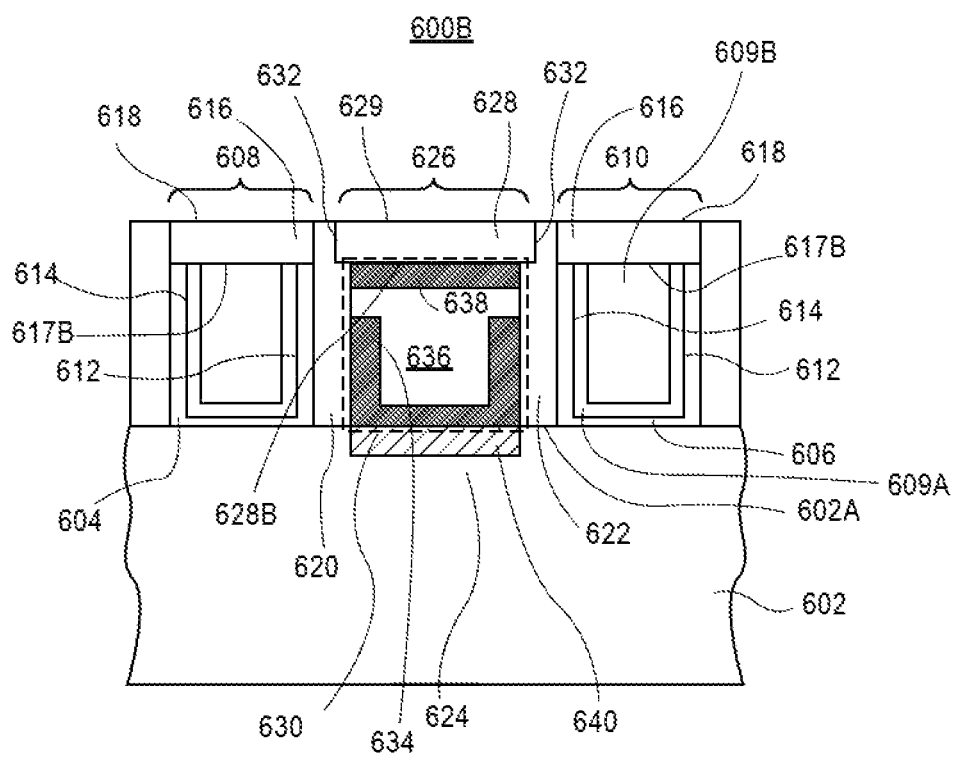
Figure 6C:
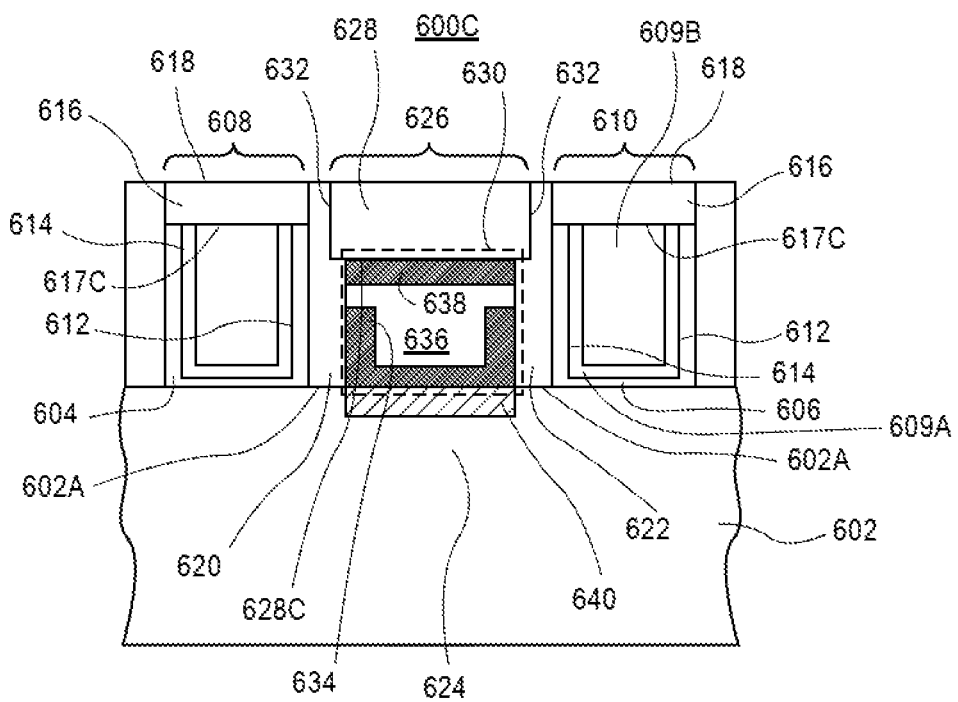

Referring to FIGS. 6A, 6B and 6C, integrated circuit structures 600A, 600B and 600C, respectively, includes a fin 602, such as a silicon fin. Although depicted as a cross-sectional view, it is to be appreciated that the fin 602 has a top 602A and sidewalls (into and out of the page of the perspective shown). First 604 and second 606 gate dielectric layers are over the top 602A of the fin 602 and laterally adjacent the sidewalls of the fin 602. First 608 and second 610 gate electrodes are over the first 604 and second 606 gate dielectric layers, respectively, over the top 602A of the fin 602 and laterally adjacent the sidewalls of the fin 602. The first 608 and second 610 gate electrodes each include a conformal conductive layer 609A. such as a workfunction-setting layer, and a conductive fill material 609B above the conformal conductive layer 609A. The first 608 and second 610 gate electrodes both have a first side 612 and a second side 614 opposite the first side 612. The first 608 and second 610 gate electrodes also both have an insulating cap 616 having a top surface 618.

A first dielectric spacer 620 is adjacent the first side 612 of the first gate electrode 608. A second dielectric spacer 622 is adjacent the second side 614 of the second gate electrode 610. A semiconductor source or drain region 624 is adjacent the first 620 and second 622 dielectric spacers. A trench contact structure 626 is over the semiconductor source or drain region 624 adjacent the first 620 and second 622 dielectric spacers.

The trench contact structure 626 includes an insulating cap 628 on a conductive structure 630. The insulating cap 628 of the trench contact structure 626 has a top surface 629 substantially co-planar with a top surfaces 618 of the insulating caps 616 of the first 608 and second 610 gate electrodes. In an embodiment, the insulating cap 628 of the trench contact structure 626 extends laterally into recesses 632 in the first 620 and second 622 dielectric spacers. In such an embodiment, the insulating cap 628 of the trench contact structure 626 overhangs the conductive structure 630 of the trench contact structure 626. In other embodiments, however, the insulating cap 628 of the trench contact structure 626 does not extend laterally into recesses 632 in the first 620 and second 622 dielectric spacers and, hence, does not overhang the conductive structure 630 of the trench contact structure 626.

It is to be appreciated that the conductive structure 630 of the trench contact structure 626 may not be rectangular, as depicted in FIGS. 6A-6C. For example, the conductive structure 630 of the trench contact structure 626 may have a cross-sectional geometry similar to or the same as the geometry shown for conductive structure 630A illustrated in the projection of FIG. 6A.

In an embodiment, the insulating cap 628 of the trench contact structure 626 has a composition different than a composition of the insulating caps 616 of the first 608 and second 610 gate electrodes. In one such embodiment, the insulating cap 628 of the trench contact structure 626 includes a carbide material, such as a silicon carbide material. The insulating caps 616 of the first 608 and second 610 gate electrodes include a nitride material, such as a silicon nitride material.

In an embodiment, the insulating caps 616 of the first 608 and second 610 gate electrodes both have a bottom surface 617A below a bottom surface 628A of the insulating cap 628 of the trench contact structure 626, as is depicted in FIG. 6A. In another embodiment, the insulating caps 616 of the first 608 and second 610 gate electrodes both have a bottom surface 617B substantially co-planar with a bottom surface 628B of the insulating cap 628 of the trench contact structure 626, as is depicted in FIG. 6B. In another embodiment, the insulating caps 616 of the first 608 and second 610 gate electrodes both have a bottom surface 617C above a bottom surface 628C of the insulating cap 628 of the trench contact structure 626, as is depicted in FIG. 6C.

In an embodiment, the conductive structure 630 of the trench contact structure 628 includes a U-shaped metal layer 634, a T-shaped metal layer 636 on and over the entirety of the U-shaped metal layer 634, and a third metal layer 638 on the T-shaped metal layer 636. The insulating cap 628 of the trench contact structure 626 is on the third metal layer 638. In one such embodiment, the third metal layer 638 and the U-shaped metal layer 634 include titanium, and the T-shaped metal layer 636 includes cobalt. In a particular such embodiment, the T-shaped metal layer 636 further includes carbon.

In an embodiment, a metal silicide layer 640 is directly between the conductive structure 630 of the trench contact structure 626 and the semiconductor source or drain region 624. In one such embodiment, the metal silicide layer 640 includes titanium and silicon. In a particular such embodiment, the semiconductor source or drain region 624 is an N-type semiconductor source or drain region. In another embodiment, the metal silicide layer 640 includes nickel, platinum and silicon. In a particular such embodiment, the semiconductor source or drain region 624 is a P-type semiconductor source or drain region. In another particular such embodiment, the metal silicide layer further includes germanium.

Figure 6D:
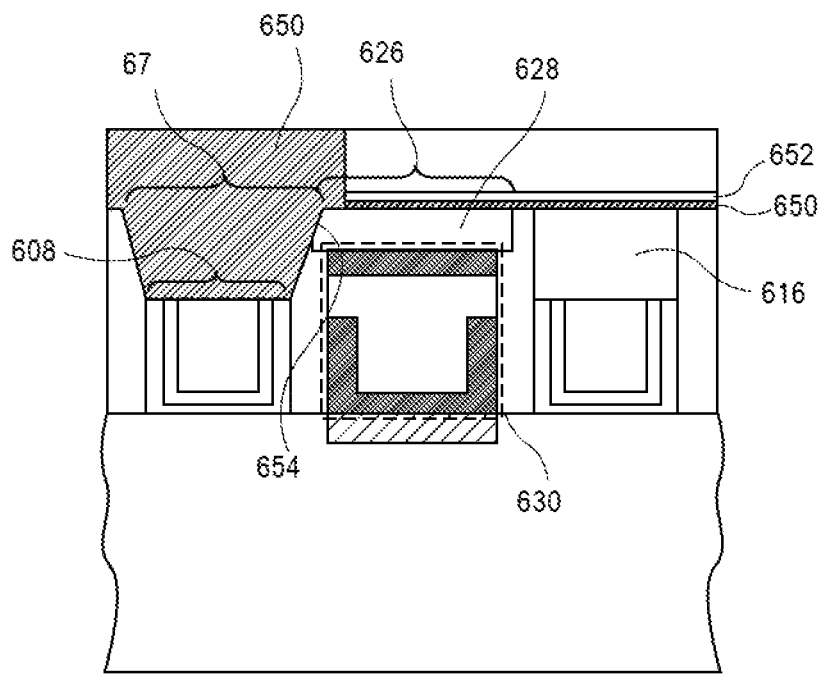

In an embodiment, referring to FIG. 6D, a conductive via 650 is on and electrically connected to a portion of the first gate electrode 608 over the top 602A of the fin 602. The conductive via 650 is in an opening in a first dielectric etch stop layer 650 (such as described in association with first dielectric etch stop layer 312) and a second dielectric etch stop layer 652 (such as described in association with second dielectric etch stop layer 314) and further into an opening 652 in the insulating cap 616 of the first gate electrode 608. In one such embodiment, the conductive via 650 is on a portion of the insulating cap 628 of the trench contact structure 626 but is not electrically connected to the conductive structure 630 of the trench contact structure 626. In a particular such embodiment, the conductive via 650 is in an eroded portion 654 of the insulating cap 628 of the trench contact structure 626.

Figure 6E:
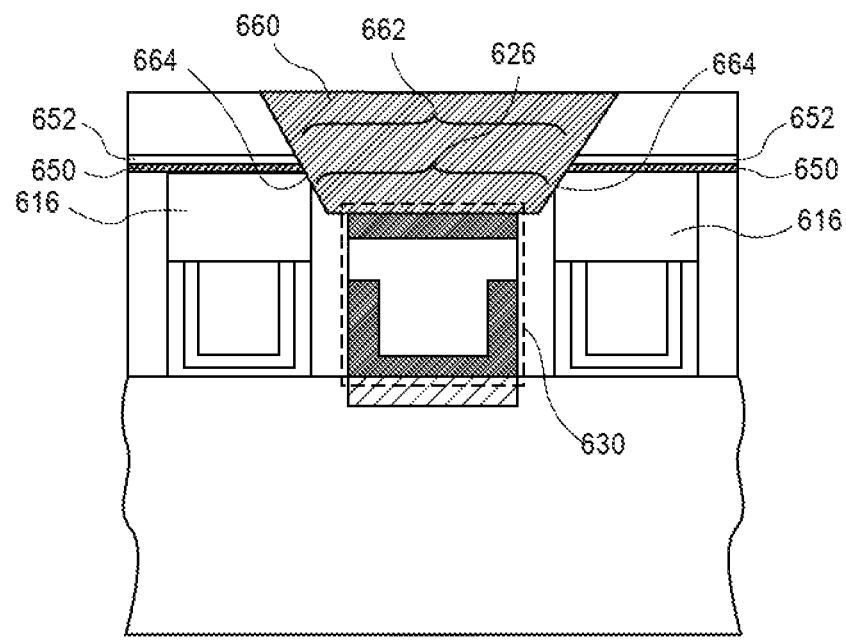

In an embodiment, referring to FIG. 6E, a conductive via 660 is on and electrically connected to a portion of the trench contact structure 626. The conductive via is in an opening in a first dielectric etch stop layer 650 (such as described in association with first dielectric etch stop layer 312) and a second dielectric etch stop layer 652 (such as described in association with second dielectric etch stop layer 314) an further in an opening 662 of the insulating cap 628 of the trench contact structure 626. In one such embodiment, the conductive via 660 is on a portion of the insulating caps 616 of the first 608 and second 610 gate electrodes but is not electrically connected to the first 608 and second 610 gate electrodes. In a particular such embodiment, the conductive via 660 is in an eroded portion 664 of the insulating caps 616 of the first 608 and second 610 gate electrodes.

Figure 6F:
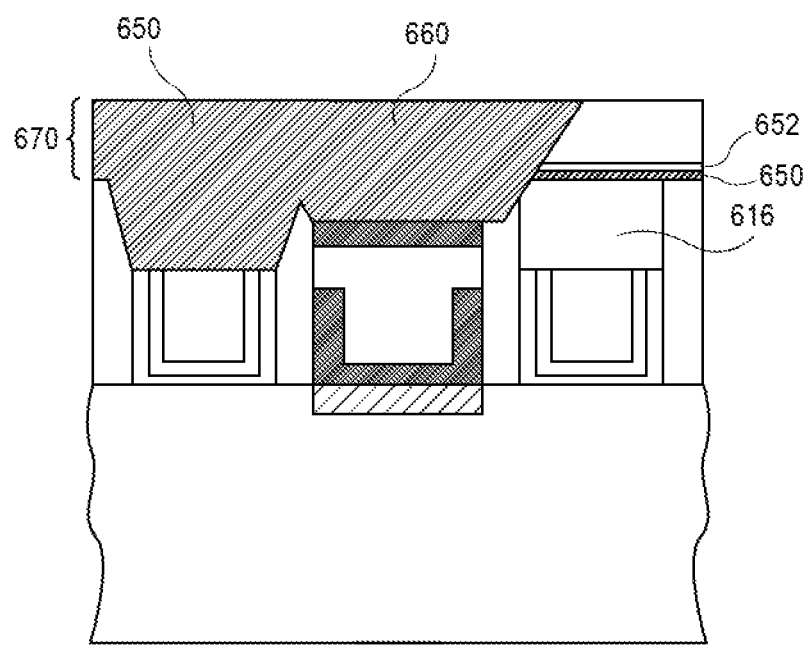

Referring again to FIG. 6E, in an embodiment, the conductive via 660 is a second conductive via in a same structure as the conductive via 650 of FIG. 6D. In one such embodiment, such a second conductive via 660 is isolated from the conductive via 650. In another such embodiment, such as second conductive via 660 is merged with the conductive via 650 to form an electrically shorting contact 670, as is depicted in FIG. 6F.

Figure 7A:
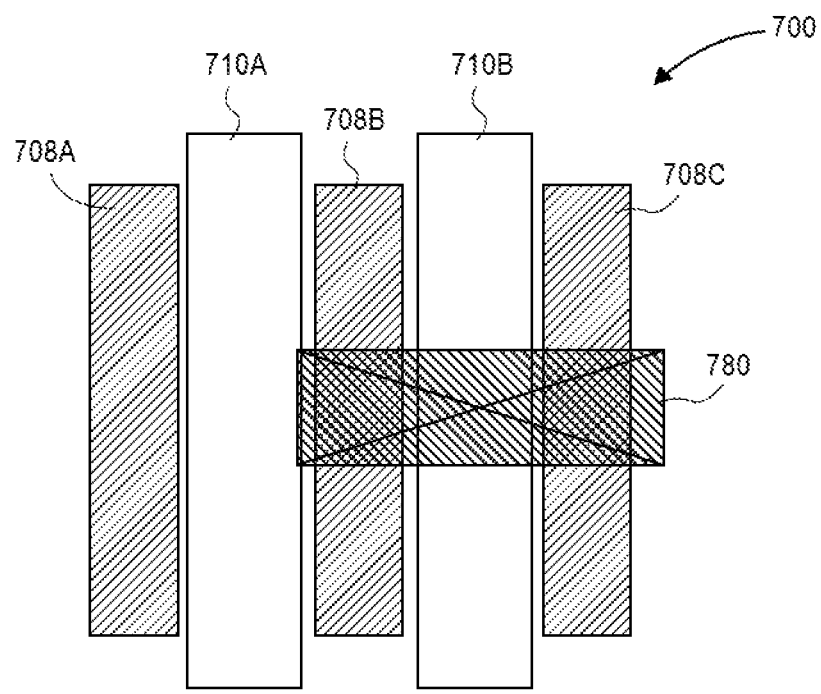
FIG. 7A illustrates a plan view of another semiconductor device having a gate contact via disposed over an active portion of a gate, in accordance with another embodiment of the present disclosure.

The approaches and structures described herein may enable formation of other structures or devices that were not possible or difficult to fabricate using other methodologies. In a first example, FIG. 7A illustrates a plan view of another semiconductor device having a gate contact via disposed over an active portion of a gate, in accordance with another embodiment of the present disclosure. Referring to FIG. 7A, a semiconductor structure or device 700 includes a plurality of gate structures 708A-708C interdigitated with a plurality of trench contacts 710A and 710B (these features are disposed above an active region of a substrate, not shown). A gate contact via 780 is formed on an active portion the gate structure 708B. The gate contact via 780 is further disposed on the active portion of the gate structure 708C, coupling gate structures 708B and 708C. It is to be appreciated that the intervening trench contact 710B may be isolated from the contact 780 by using a trench contact isolation cap layer (e.g., TILA). The contact configuration of FIG. 7A may provide an easier approach to strapping adjacent gate lines in a layout, without the need to route the strap through upper layers of metallization, hence enabling smaller cell areas or less intricate wiring schemes, or both.

Figure 7B:
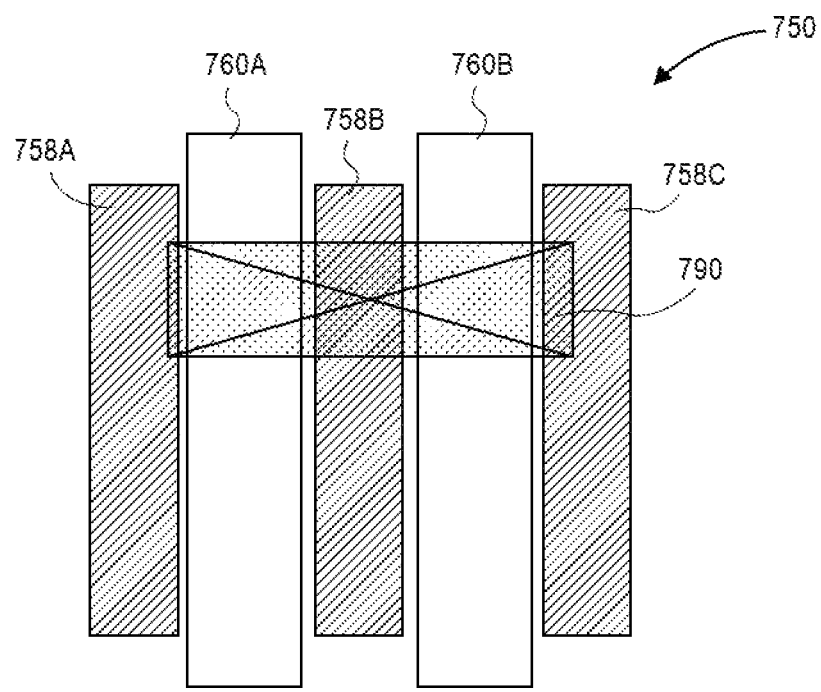
FIG. 7B illustrates a plan view of another semiconductor device having a trench contact via coupling a pair of trench contacts, in accordance with another embodiment of the present disclosure.

In a second example, FIG. 7B illustrates a plan view of another semiconductor device having a trench contact via coupling a pair of trench contacts, in accordance with another embodiment of the present disclosure. Referring to FIG. 7B, a semiconductor structure or device 750 includes a plurality of gate structures 758A-758C interdigitated with a plurality of trench contacts 760A and 760B (these features are disposed above an active region of a substrate, not shown). A trench contact via 790 is formed on the trench contact 760A. The trench contact via 790 is further disposed on the trench contact 760B, coupling trench contacts 760A and 760B. It is to be appreciated that the intervening gate structure 758B may be isolated from the trench contact via 790 by using a gate isolation cap layer (e.g., by a GILA process). The contact configuration of FIG. 7B may provide an easier approach to strapping adjacent trench contacts in a layout, without the need to route the strap through upper layers of metallization, hence enabling smaller cell areas or less intricate wiring schemes, or both.

An insulating cap layer for a gate electrode may be fabricated using several deposition operations and, as a result, may include artifacts of a multi-deposition fabrication process. As an example, FIGS. 8A-8F illustrate cross-sectional views representing various operations in a method of fabricating an integrated circuit structure with a gate stack having an overlying insulating cap layer, in accordance with an embodiment of the present disclosure.

Figure 8A:
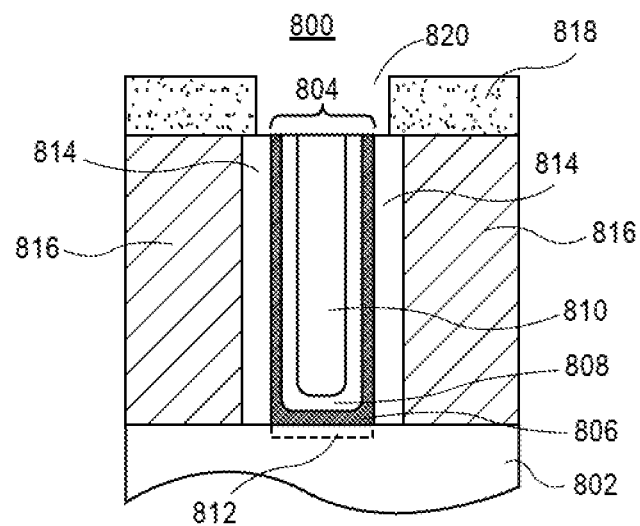
FIGS. 8A-8F illustrate cross-sectional views representing various operations in a method of fabricating an integrated circuit structure with a gate stack having an overlying insulating cap layer, in accordance with an embodiment of the present disclosure.

Referring to FIG. 8A, a starting structure 800 includes a gate stack 804 above a substrate or fin 802. The gate stack 804 includes a gate dielectric layer 806, a conformal conductive layer 808, and a conductive fill material 810. In an embodiment, the gate dielectric layer 806 is a high-k gate dielectric layer formed using an atomic layer deposition (ALD) process, and the conformal conductive layer is a workfunction layer formed using an ALD process. In one such embodiment, a thermal or chemical oxide layer 812, such as a thermal or chemical silicon dioxide or silicon oxide layer, is between the substrate or fin 802 and the gate dielectric layer 806. Dielectric spacers 814, such as silicon nitride spacers, are adjacent sidewalls of the gate stack 804. The dielectric gate stack 804 and the dielectric spacers 814 are housed in an inter-layer-dielectric (ILD) layer 816. In an embodiment, the gate stack 804 is formed using a replacement gate and replacement gate dielectric processing scheme. A mask 818 is patterned above the gate stack 804 and ILD layer 816 to provide an opening 820 exposing the gate stack 804.

Figure 8B:
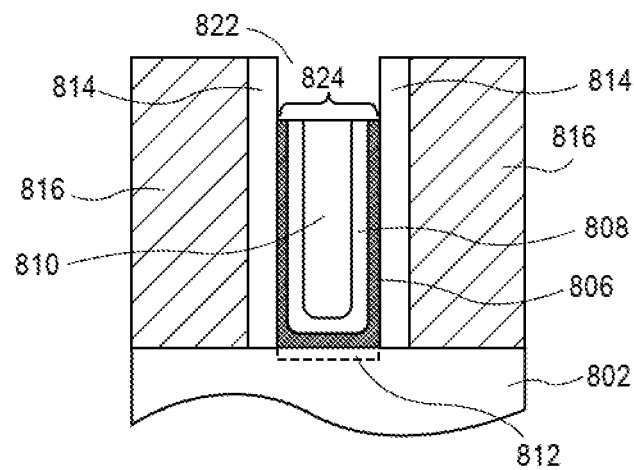

Referring to FIG. 8B, using a selective etch process or processes, the gate stack 804, including gate dielectric layer 806, conformal conductive layer 808, and conductive fill material 810, are recessed relative to dielectric spacers 814 and layer 816. Mask 818 is then removed. The recessing provides a cavity 822 above a recessed gate stack 824.

In another embodiment, not depicted, conformal conductive layer 808 and conductive fill material 810 are recessed relative to dielectric spacers 814 and layer 816, but gate dielectric layer 806 is not recessed or is only minimally recessed. It is to be appreciated that, in other embodiments, a maskless approach based on high etch selectivity is used for the recessing.

Figure 8C:
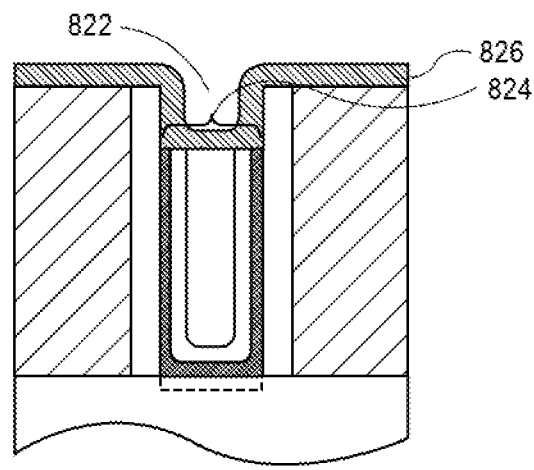

Referring to FIG. 8C, a first deposition process in a multi-deposition process for fabricating a gate insulating cap layer is performed. The first deposition process is used to form a first insulating layer 826 conformal with the structure of FIG. 8B. In an embodiment, the first insulating layer 826 includes silicon and nitrogen, e.g., the first insulating layer 826 is a silicon nitride ($Si_3N_4$) layer, a silicon rich silicon nitride layer, a silicon-poor silicon nitride layer, or a carbon-doped silicon nitride layer. In an embodiment, the first insulating layer 826 only partially fills the cavity 822 above the recessed gate stack 824, as is depicted.

Figure 8D:
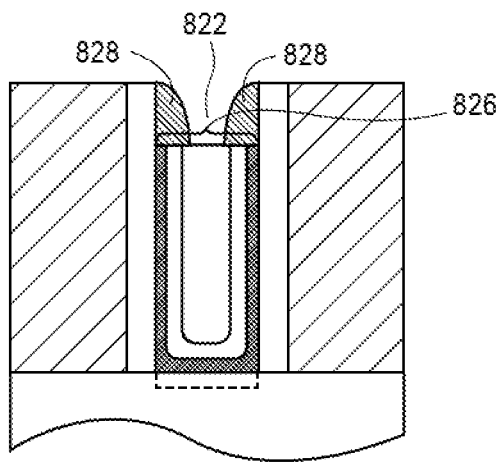

Referring to FIG. 8D, the first insulating layer 826 is subjected to an etch-back process, such as an anisotropic etch process, to provide first portions 828 of an insulating cap layer. The first portions 828 of an insulating cap layer only partially fill the cavity 822 above the recessed gate stack 824.

Figure 8E:
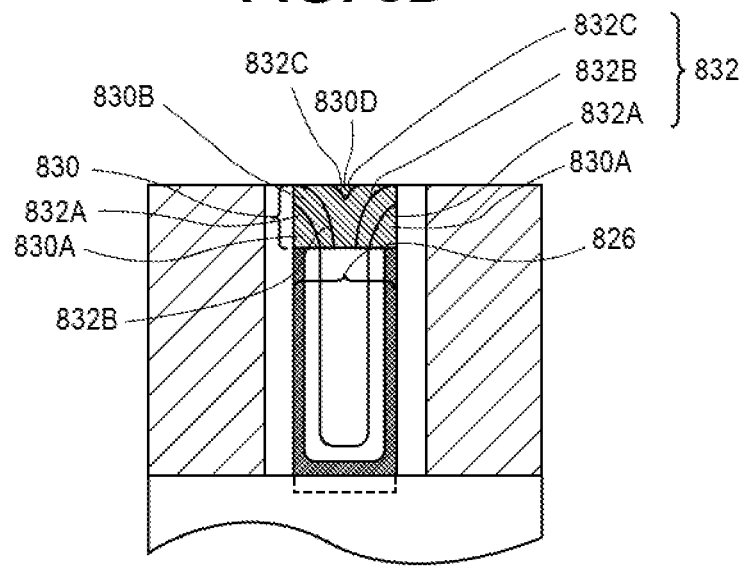

Referring to FIG. 8E, additional alternating deposition processes and etch-back processes are performed until cavity 822 is filled with an insulating gate cap structure 830 above the recessed gate stack 824. Seams 832 may be evident in cross-sectional analysis and may be indicative of the number of alternating deposition processes and etch-back processes used to insulating gate cap structure 830. In the example shown in FIG. 8E, the presence of three sets of seams 832A, 832B and 832C is indicative of four alternating deposition processes and etch-back processes used to insulating gate cap structure 830. In an embodiment, the material 830A, 830B, 830C and 830D of insulating gate cap structure 830 separated by seams 832 all have exactly or substantially the same composition.

Figure 8F:
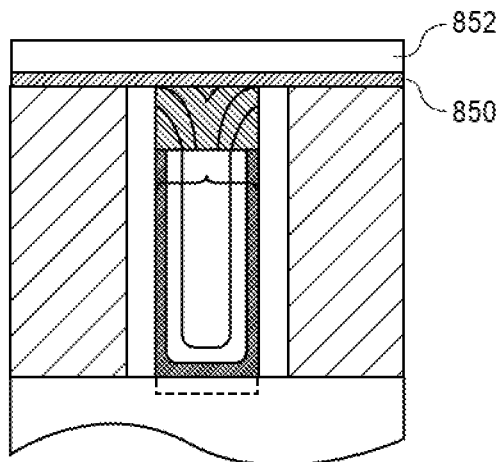

Referring to FIG. 8F, a first dielectric etch stop layer 850 (such as described in association with first dielectric etch stop layer 312) is formed on the structure of FIG. 8E. A second dielectric etch stop layer 852 (such as described in association with second dielectric etch stop layer 314) is formed on the first dielectric etch stop layer 850.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
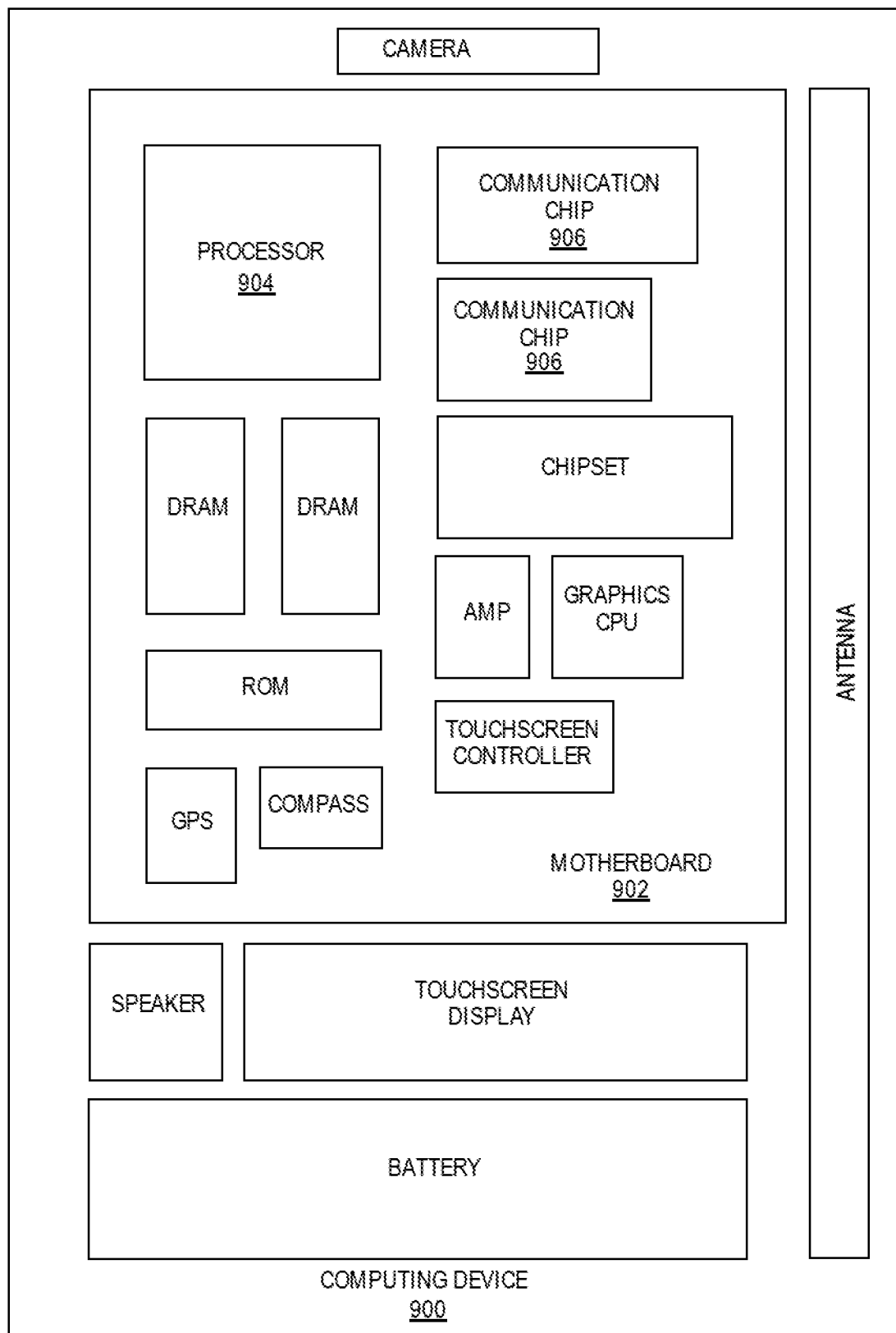
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 906 also includes an integrated circuit die packaged within the communication chip 906. In accordance with another implementation of the disclosure, the integrated circuit die of the communication chip is built in accordance with implementations of the disclosure.

In further implementations, another component housed within the computing device 900 may contain an integrated circuit die built in accordance with implementations of embodiments of the disclosure.

In various embodiments, the computing device 900 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
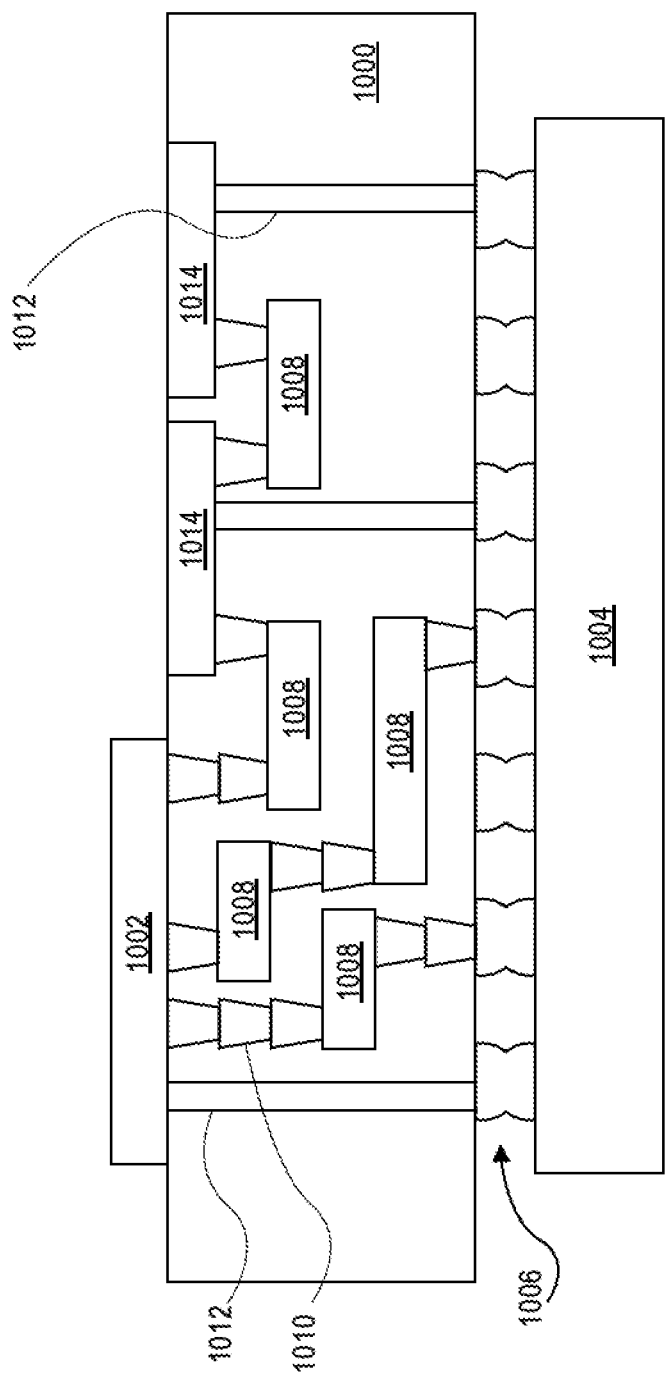
FIG. 10 illustrates an interposer that includes one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 8000. In accordance with embodiments of the disclosure, apparatuses or processes disclosed herein may be used in the fabrication of interposer 1000 or in the fabrication of components included in the interposer 1000.

Figure 11:
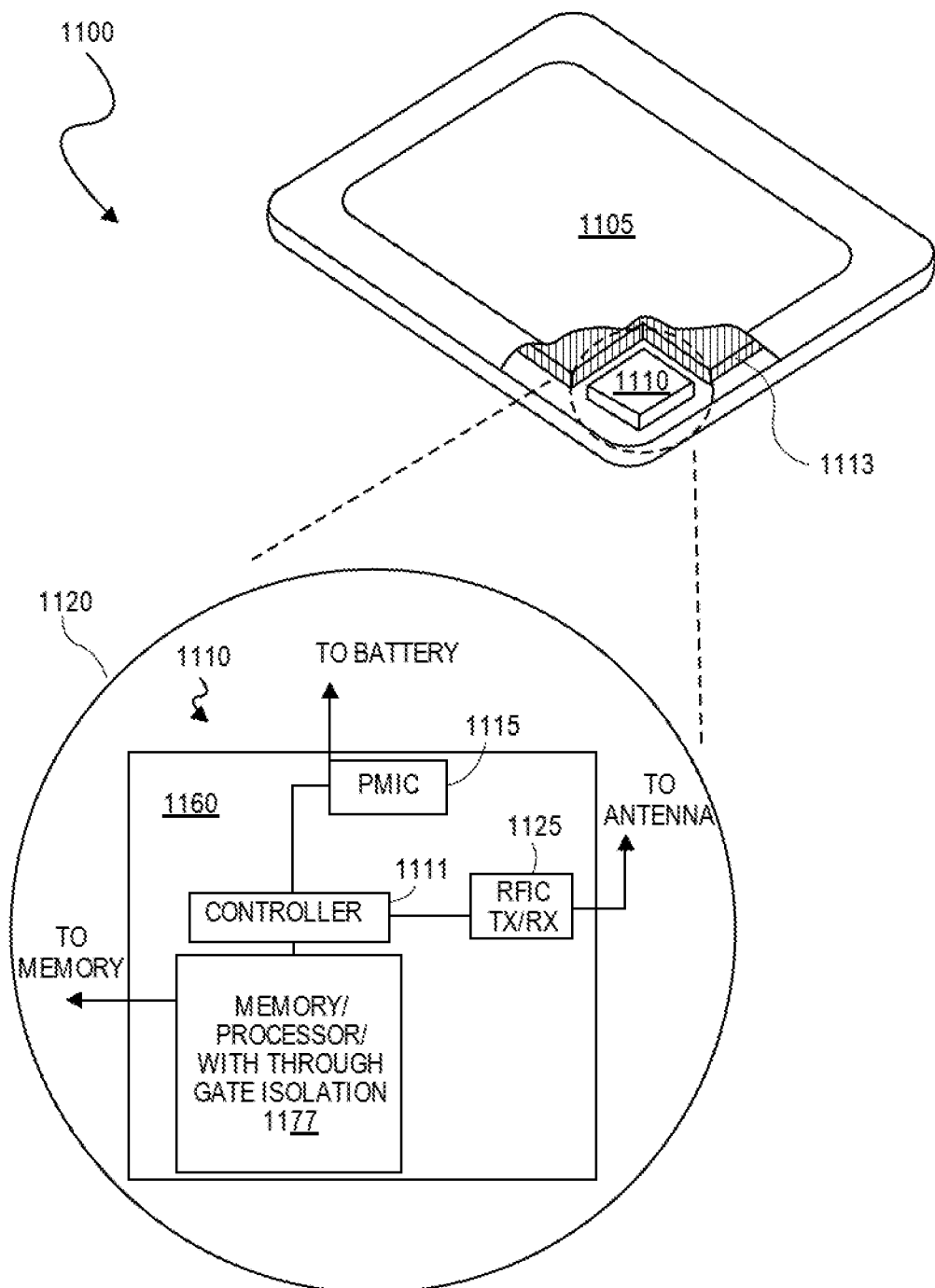
FIG. 11 is an isometric view of a mobile computing platform employing an IC fabricated according to one or more processes described herein or including one or more features described herein, in accordance with an embodiment of the present disclosure.

FIG. 11 is an isometric view of a mobile computing platform 1100 employing an integrated circuit (IC) fabricated according to one or more processes described herein or including one or more features described herein, in accordance with an embodiment of the present disclosure.

The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105 which in the exemplary embodiment is a touchscreen (capacitive, inductive, resistive, etc.), a chip-level (SoC) or package-level integrated system 1110, and a battery 1113. As illustrated, the greater the level of integration in the system 1110 enabled by higher transistor packing density, the greater the portion of the mobile computing platform 1100 that may be occupied by the battery 1113 or non-volatile storage, such as a solid state drive, or the greater the transistor gate count for improved platform functionality. Similarly, the greater the carrier mobility of each transistor in the system 1110, the greater the functionality. As such, techniques described herein may enable performance and form factor improvements in the mobile computing platform 1100.

The integrated system 1110 is further illustrated in the expanded view 1120. In the exemplary embodiment, packaged device 1177 includes at least one memory chip (e.g., RAM), or at least one processor chip (e.g., a multi-core microprocessor and/or graphics processor) fabricated according to one or more processes described herein or including one or more features described herein. The packaged device 1177 is further coupled to the board 1160 along with one or more of a power management integrated circuit (PMIC) 1115, RF (wireless) integrated circuit (RFIC) 1125 including a wideband RF (wireless) transmitter and/or receiver (e.g., including a digital baseband and an analog front end module further includes a power amplifier on a transmit path and a low noise amplifier on a receive path), and a controller thereof 1111. Functionally, the PMIC 1115 performs battery power regulation, DC-to-DC conversion, etc., and so has an input coupled to the battery 1113 and with an output providing a current supply to all the other functional modules. As further illustrated, in the exemplary embodiment, the RFIC 1125 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1177 or within a single IC (SoC) coupled to the package substrate of the packaged device 1177.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 12:
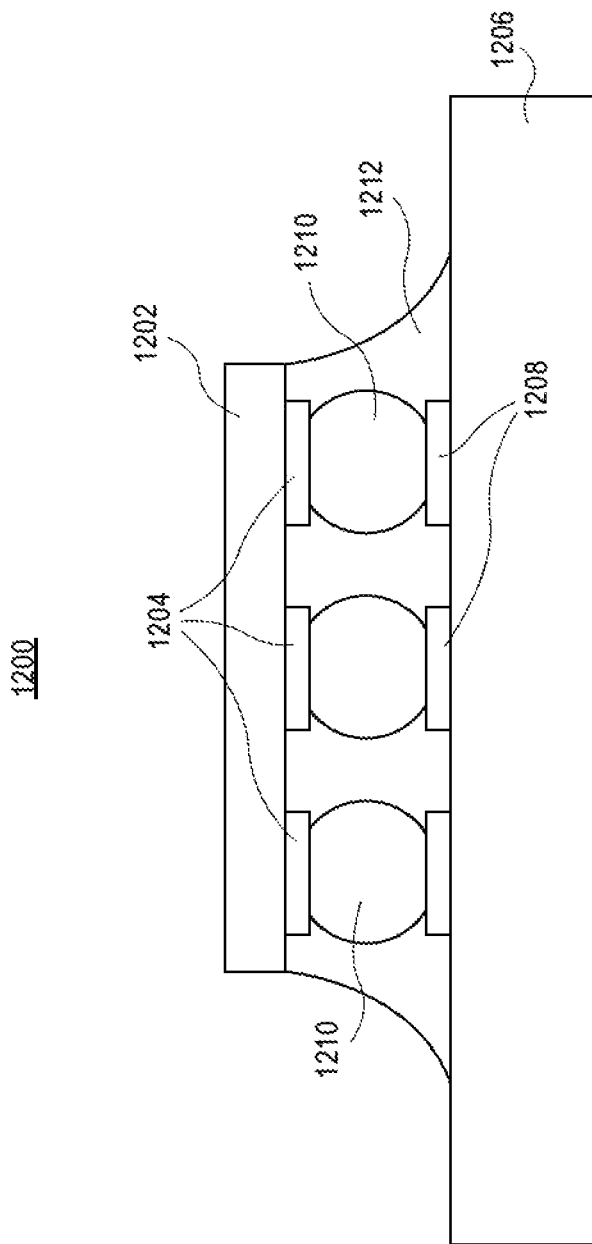
FIG. 12 illustrates a cross-sectional view of a flip-chip mounted die, in accordance with an embodiment of the present disclosure.

FIG. 12 illustrates a cross-sectional view of a flip-chip mounted die, in accordance with an embodiment of the present disclosure.

Referring to FIG. 12, an apparatus 1200 includes a die 1202 such as an integrated circuit (IC) fabricated according to one or more processes described herein or including one or more features described herein, in accordance with an embodiment of the present disclosure. The die 1202 includes metallized pads 1204 thereon. A package substrate 1206, such as a ceramic or organic substrate, includes connections 1208 thereon. The die 1202 and package substrate 1206 are electrically connected by solder balls 1210 coupled to the metallized pads 1204 and the connections 1208. An underfill material 1212 surrounds the solder balls 1210.

Processing a flip chip may be similar to conventional IC fabrication, with a few additional operations. Near the end of the manufacturing process, the attachment pads are metallized to make them more receptive to solder. This typically consists of several treatments. A small dot of solder is then deposited on each metallized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include contact over active gate (COAG) structures with etch stop layers, and methods of fabricating contact over active gate (COAG) structures using etch stop layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate structures above substrate, each of the gate structures including a gate insulating layer thereon. A plurality of conductive trench contact structures is alternating with the plurality of gate structures, each of the conductive trench contact structures including a trench insulating layer thereon. A first dielectric etch stop layer is directly on and continuous over the trench insulating layers and the gate insulating layers. A second dielectric etch stop layer is directly on and continuous over the first dielectric etch stop layer, the second dielectric etch stop layer distinct from the first dielectric etch stop layer. An interlayer dielectric material is on the second dielectric etch stop layer. An opening is in the interlayer dielectric material, in the second dielectric etch stop layer, in the first dielectric etch stop layer, and in one of the trench insulating layers. A conductive structure is in the opening, the conductive structure in direct contact with a corresponding one of the trench contact structures.

Example embodiment 2: The integrated circuit structure of example embodiment 1, wherein the second dielectric etch stop layer includes aluminum and oxygen.

Example embodiment 3: The integrated circuit structure of example embodiment 1 or 2, wherein the first etch stop layer includes nitrogen, silicon and hydrogen.

Example embodiment 4: The integrated circuit structure of example embodiment 1, 2 or 3, wherein the interlayer dielectric material includes silicon, oxygen, carbon and hydrogen.

Example embodiment 5: The integrated circuit structure of example embodiment 1, 2, 3 or 4, wherein the trench insulating layers include silicon carbide, and the gate insulating layers include silicon nitride.

Example embodiment 6: The integrated circuit structure of example embodiment 1, 2, 3, 4 or 5, further including a plurality of dielectric spacers alternating with the plurality of gate structures and the plurality of conductive trench contact structures, wherein the first dielectric etch stop layer is directly on the plurality of dielectric spacers.

Example embodiment 7: The integrated circuit structure of example embodiment 1, 2, 3, 4, 5 or 6, wherein the plurality of conductive trench contact structures and the plurality of gate structures are on a semiconductor fin.

Example embodiment 8: The integrated circuit structure of example embodiment 1, 2, 3, 4, 5, 6 or 7, wherein the conductive structure includes an upper conductive line and a lower conductive via.

Example embodiment 9: An integrated circuit structure includes a plurality of gate structures above substrate, each of the gate structures including a gate insulating layer thereon. A plurality of conductive trench contact structures is alternating with the plurality of gate structures, each of the conductive trench contact structures including a trench insulating layer thereon. A first dielectric etch stop layer is directly on and continuous over the trench insulating layers and the gate insulating layers. A second dielectric etch stop layer is directly on and continuous over the first dielectric etch stop layer, the second dielectric etch stop layer distinct from the first dielectric etch stop layer. An interlayer dielectric material is on the second dielectric etch stop layer. An opening is in the interlayer dielectric material, in the second dielectric etch stop layer, in the first dielectric etch stop layer, and in one of the gate insulating layers. A conductive structure is in the opening, the conductive structure in direct contact with a corresponding one of the gate structures.

Example embodiment 10: The integrated circuit structure of example embodiment 9, wherein the second dielectric etch stop layer includes aluminum and oxygen.

Example embodiment 11: The integrated circuit structure of example embodiment 9 or 10, wherein the first etch stop layer includes nitrogen, silicon and hydrogen.

Example embodiment 12: The integrated circuit structure of example embodiment 9, 10 or 11, wherein the interlayer dielectric material includes silicon, oxygen, carbon and hydrogen.

Example embodiment 13: The integrated circuit structure of example embodiment 9, 10, 11 or 12, wherein the trench insulating layers include silicon carbide, and the gate insulating layers include silicon nitride.

Example embodiment 14: The integrated circuit structure of example embodiment 9, 10, 11, 12 or 13, further including a plurality of dielectric spacers alternating with the plurality of gate structures and the plurality of conductive trench contact structures, wherein the first dielectric etch stop layer is directly on the plurality of dielectric spacers.

Example embodiment 15: The integrated circuit structure of example embodiment 9, 10, 11, 12, 13 or 14, wherein the plurality of conductive trench contact structures and the plurality of gate structures are on a semiconductor fin.

Example embodiment 16: The integrated circuit structure of example embodiment 9, 10, 11, 12, 13, 14 or 15, wherein the conductive structure includes an upper conductive line and a lower conductive via.

Example embodiment 17: A method of fabricating an integrated circuit structure includes forming a plurality of gate structures above substrate, each of the gate structures including a gate insulating layer thereon. The method also includes forming a plurality of conductive trench contact structures alternating with the plurality of gate structures, each of the conductive trench contact structures including a trench insulating layer thereon. The method also includes forming a first dielectric etch stop layer directly on and continuous over the trench insulating layers and the gate insulating layers. The method also includes forming a second dielectric etch stop layer directly on and continuous over the first dielectric etch stop layer, the second dielectric etch stop layer distinct from the first dielectric etch stop layer. The method also includes forming an interlayer dielectric material on the second dielectric etch stop layer. The method also includes forming an opening in the interlayer dielectric material using a first dry or plasma etch process. The method also includes extending the opening in the second dielectric etch stop layer using a wet etch process. The method also includes further extending the opening in the first dielectric etch stop layer and in one of the trench insulating layers using a second dry or plasma etch process. The method also includes forming a conductive structure in the opening, the conductive structure in direct contact with a corresponding one of the trench contact structures.

Example embodiment 18: The method of example embodiment 17, wherein the second dielectric etch stop layer includes aluminum and oxygen.

Example embodiment 19: The method of example embodiment 17 or 18, wherein the first etch stop layer includes nitrogen, silicon and hydrogen.

Example embodiment 20: The method of example embodiment 17, 18 or 19, wherein the interlayer dielectric material includes silicon, oxygen, carbon and hydrogen, and wherein the trench insulating layers include silicon carbide.

Example embodiment 21: A method of fabricating an integrated circuit structure includes forming a plurality of gate structures above substrate, each of the gate structures including a gate insulating layer thereon. The method also includes forming a plurality of conductive trench contact structures alternating with the plurality of gate structures, each of the conductive trench contact structures including a trench insulating layer thereon. The method also includes forming a first dielectric etch stop layer directly on and continuous over the trench insulating layers and the gate insulating layers. The method also includes forming a second dielectric etch stop layer directly on and continuous over the first dielectric etch stop layer, the second dielectric etch stop layer distinct from the first dielectric etch stop layer. The method also includes forming an interlayer dielectric material on the second dielectric etch stop layer. The method also includes forming an opening in the interlayer dielectric material using a first dry or plasma etch process. The method also includes extending the opening in the second dielectric etch stop layer using a wet etch process. The method also includes further extending the opening in the first dielectric etch stop layer and in one of the gate insulating layers using a second dry or plasma etch process. The method also includes forming a conductive structure in the opening, the conductive structure in direct contact with a corresponding one of the gate structures.

Example embodiment 22: The method of example embodiment 21, wherein the second dielectric etch stop layer includes aluminum and oxygen.

Example embodiment 23: The method of example embodiment 21 or 22, wherein the first etch stop layer includes nitrogen, silicon and hydrogen.

Example embodiment 24: The method of example embodiment 21, 22 or 23, wherein the interlayer dielectric material includes silicon, oxygen, carbon and hydrogen, and wherein the gate insulating layers include silicon nitride.

What is claimed is:

1. An integrated circuit structure, comprising:
    a plurality of gate structures above substrate, each of the gate structures including a gate insulating layer thereon;
    a plurality of conductive trench contact structures alternating with the plurality of gate structures, each of the conductive trench contact structures including a trench insulating layer thereon;
    a first dielectric etch stop layer directly on and continuous over the trench insulating layers and the gate insulating layers;
    a second dielectric etch stop layer directly on and continuous over the first dielectric etch stop layer, the second dielectric etch stop layer distinct from the first dielectric etch stop layer;
    an interlayer dielectric material on the second dielectric etch stop layer;
    an opening in the interlayer dielectric material, in the second dielectric etch stop layer, in the first dielectric etch stop layer, and in one of the trench insulating layers; and
    a conductive structure in the opening, the conductive structure in direct contact with a corresponding one of the trench contact structures.

2. The integrated circuit structure of claim 1, wherein the second dielectric etch stop layer comprises aluminum and oxygen.

3. The integrated circuit structure of claim 1, wherein the first etch stop layer comprises nitrogen, silicon and hydrogen.

4. The integrated circuit structure of claim 1, wherein the interlayer dielectric material comprises silicon, oxygen, carbon and hydrogen.

5. The integrated circuit structure of claim 1, wherein the trench insulating layers comprise silicon carbide, and the gate insulating layers comprise silicon nitride.

6. The integrated circuit structure of claim 1, further comprising:
    a plurality of dielectric spacers alternating with the plurality of gate structures and the plurality of conductive trench contact structures, wherein the first dielectric etch stop layer is directly on the plurality of dielectric spacers.

7. The integrated circuit structure of claim 1, wherein the plurality of conductive trench contact structures and the plurality of gate structures are on a semiconductor fin.

8. The integrated circuit structure of claim 1, wherein the conductive structure includes an upper conductive line and a lower conductive via.

* * * * *